(12) United States Patent
Bennett et al.

(10) Patent No.: US 8,604,511 B2
(45) Date of Patent: *Dec. 10, 2013

(54) PHOTON SOURCE

(75) Inventors: Anthony John Bennett, Cambridge (GB); Andrew James Shields, Cambridge (GB)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/419,525

(22) Filed: Mar. 14, 2012

(65) Prior Publication Data

US 2012/0326624 A1  Dec. 27, 2012

Related U.S. Application Data

(62) Division of application No. 11/292,344, filed on Dec. 2, 2005, now Pat. No. 8,227,830.

(30) Foreign Application Priority Data

Dec. 3, 2004 (GB) .................................. 0426614.4

(51) Int. Cl.
*H01L 33/00* (2010.01)
(52) U.S. Cl.
USPC ................ 257/103; 257/79; 257/E31.001
(58) Field of Classification Search
USPC .................... 257/79, 103, E31.001
See application file for complete search history.

(56) References Cited

U.S. PATENT DOCUMENTS

| 6,778,581 | B1 | 8/2004 | Lipson |
| 8,227,830 | B2* | 7/2012 | Bennett et al. ............... 257/103 |
| 2003/0127608 | A1* | 7/2003 | Shields et al. ............. 250/493.1 |
| 2003/0185267 | A1 | 10/2003 | Hwang et al. |
| 2004/0197070 | A1 | 10/2004 | Takemoto et al. |
| 2005/0199870 | A1 | 9/2005 | Gray et al. |

FOREIGN PATENT DOCUMENTS

| GB | 2 367 690 A | 4/2002 |
| GB | 2367390 | 4/2002 |
| GB | 2 380 605 A | 4/2003 |
| GB | 2380605 | 4/2003 |
| WO | WO 2005/004295 | 1/2005 |
| WO | WO 2005/024952 | 3/2005 |

OTHER PUBLICATIONS

Oliver Benson, et al., "Regulated and Entangled Photons from a Singe Quantum Dot", Physical Review Letters, vol. 84, No. 11, Mar. 13, 2000, pp. 2513-2516.

* cited by examiner

*Primary Examiner* — Eduardo A Rodela
(74) *Attorney, Agent, or Firm* — Oblon, Spivak, McClelland, Maier & Neustadt, L.L.P.

(57) ABSTRACT

A photon source comprising a photon source body, said photon source body comprising at least one quantum dot; carrier injection means for injecting carriers into said at least one quantum dot and change of state means for changing the state of the carriers within the quantum dot after a predetermined time duration, the carrier injection means injecting carriers which are configured to allow emission of radiation by radiative recombination.

14 Claims, 21 Drawing Sheets

PHOTON SOURCE

CROSS-REFERENCE TO RELATED APPLICATIONS

This application is a division of and claims the benefit of priority under 35 U.S.C. §120 from U.S. Ser. No. 11/292,344 filed Dec. 2, 2005, the entire contents of which are incorporated herein by reference.

FIELD OF INVENTION

The present invention relates to the field of photon sources which are capable of emitting a predetermined number of photons at predetermined times.

BACKGROUND OF INVENTION

There is a need for single and entangled-pair photon sources for use in quantum information technology. In quantum cryptography bits can be exchanged on an open optical network along with an estimate of the probability that they were intercepted on-route. This can be used to form a cryptographic key for subsequent confidential communication over a network.

Single photon sources have been described in Michler et al in "A Quantum Dot Single Photon Turnstile Device" Science 290 p 2282-2284 (2000) and Santori et al "Triggered Single Photons from a Quantum Dot" Physical Review Letters 86 p 1502-1505 (2001) which describe single photon sources which operate by optically pumping a single quantum dot.

Electrically injected single photon emitters have been proposed by J. Kim et al in Nature, 397, p 500 (1999) based upon an etched quantum dot structure and also in a theoretical paper by Benson et al, Physical Review Letters 84 p 2513-2516 (2000).

A single photon source is also described in our co-pending application GB 2380605.

In all the prior art single photon sources described above electrons and holes are either optically or electrically injected into a quantum dot. The injected carriers then recombine to emit photons.

The average duration for this recombination process is given by the radiative decay time for the corresponding optical transition of the quantum dot. Ultimately this limits the jitter in the photon emission time from the dot and the maximum operating frequency.

SUMMARY OF INVENTION

It is therefore an object of the present invention to provide a photon source which reduces the uncertainty on the emission time of the photon. The invention has applications in (i) the generation of indistinguishable photons; (ii) high speed operation of single photon sources; (iii) synchronised quantum communication and (iv) synchronised quantum computing.

According to a first aspect the present invention provides a photon source comprising a photon source body, said photon source body comprising at least one quantum dot; carrier injection means for injecting carriers into said at least one quantum dot and change of state means for changing the state of the carriers within the quantum dot after a predetermined time duration, the carrier injection means injecting carriers which are configured to allow emission of radiation by radiative recombination.

In the present invention a photon source which comprises at least one quantum dot is populated with carriers (electrons and holes). In prior art devices these carriers would be allowed to recombine and the average duration for photon emission would be governed by the radiative decay time.

By contrast, in the present invention, the state of the carriers in the quantum dot is changed after a predetermined length of time (this predetermined length of time being less than the radiative decay time). This thereby allows the output pulse duration of the source to be selected and therefore allows the jitter in the device to be reduced compared to prior art devices.

The change of state of the carriers may include (i) removal of one or both types of carrier from the quantum dot; (ii) addition of one or both types of carrier to the quantum dot; (iii) emptying the quantum dot of all types of carrier; (iv) separating the charges within the source body, e.g. by moving one or other carrier type into a further structure within the source body; (v) moving the carriers into an optically "dark" state (Note: an optically "dark" state is a state in which the configuration of the spins in the quantum dot is such that radiative recombination is forbidden under the rules of quantum mechanics. For instance, the emission of a photon can only accompany a transition where the total spin of the charges changes by −1 and it may be possible to switch the carriers into a state where this is not possible. Also, the dark state could just involve "polarising" the excitonic dipole along one direction (i.e separating the charges within the quantum dot ("QD")) under the rules of quantum mechanics this dipole cannot now emit photons along its axis and is therefore optically "dark" along that direction).

The change of state means may conveniently be provided by an electrical bias applied across the source body which allows at least one type of carrier (electron or hole) to tunnel out of or into the at least one dot.

Alternatively, the change of state means may conveniently be provided by an electrical bias applied across the source body which removes carriers of both types from the at least one dot.

Preferably a pulsed bias is applied to the photon source. Such a pulsed bias could, for example, be arranged to switch between various bias levels to add or remove one or both types of carrier from the device or to completely empty the quantum dot(s).

At a predetermined bias level both electrons and holes will be injected into the at least one quantum dot. Conveniently the pulsed bias can therefore provide both the carrier injection means and the change of state means by switching between a first bias level above the predetermined level (where carriers will be injected into the device) and a second bias level below the predetermined level (where the state configuration of the carrier within the quantum dot is changed).

The pulsed bias can potentially switch between a plurality of bias levels, e.g. to inject only one type of carrier into the at least one quantum dot or to inject both types. Also, the pulsed bias may be required to switch between different bias levels in order to add or remove both electrons and holes from the quantum dot.

For a sequence of pulses, the state of the quantum dot at the start of each pulse may be different depending on whether a photon has been or has not been emitted in the previous pulse. In such cases "bunching" or "anti-bunching" of photons may be apparent in any autocorrelation measurement that is applied to the output of the photon source.

In other words, photon emission in one pulse may favour/dis-favour the creation of a photon in the next pulse thereby increasing/decreasing the probability of 2 photons being created in adjacent pulses. This can have a detrimental effect on the device efficiency. There are several techniques that can be employed to reduce this possibility, for example the at least one quantum dot may be emptied between pulses by reducing the bias level to the point where all carriers are removed from the at least one quantum dot.

Therefore, in order to mitigate the effects of photon "bunching", complex electrical pulse sequences may be required (where the bias level is set to several different values between optical emission pulses) so as to ensure that the probability of photon emission in a given pulse is independent of whether a photon was emitted in the previous pulse.

As an alternative to electrical injection of carriers the photon source body may be optically excited in order to inject carriers into the at least one quantum dot. With optical excitation quantum dots within the source body structure can be excited with laser pulses that are resonant with excited states in the quantum dot which helps ensure that carrier population in other states is lower. This has advantages in the generation of indistinguishable and entangled photons.

Optical excitation may either be continuous or pulsed.

For example, pulsed biasing means may apply a first bias to the source body that is slightly below the level at which both holes and electrons are injected into the at least one quantum dot. The quantum dot(s) may then be populated by an optical pulse. A change in the state of the carriers in the quantum dot may then be provided by the pulsed bias means switching to a second bias level which allows at least one polarity of carrier to tunnel to or from the at least one dot.

The pulse bias means may additionally switch between a plurality of bias levels to remove all carriers from the at least one dot.

The photon source may similarly be operated under continuous optical excitation conditions, i.e. a pulsed bias means may switch between first and second bias levels (both of which are below the bias level required to inject both holes and electrons) such that carriers are injected only when the bias is at the first bias level (assuming the first bias is greater than second bias level).

Conveniently the photon source body may comprise a p-i-n structure wherein the at least one quantum dot is located in the intrinsic region of the structure.

More specifically, the source body may comprise a p-i-n structure and the quantum dot may be designed such that the energy levels in the QD may be changed relative to the Fermi level. This would facilitate the addition of one polarity of carriers to the quantum dot when the voltage across the device is reduced, thereby switching the system into a charged state.

The source body may additionally comprise a quantum well structure that is in a position proximal to the at least one quantum dot. Since the quantum well has quantised energy levels suitable design of the well/dot energy levels can help optimise performance of the photon source. In both the quantum well and the quantum dot the number and energy of the quantised levels could be controlled through appropriate choice of alloy composition and physical dimensions during the growth process. Variation of the bias across the device would allow the energy levels in the quantum well and quantum dot to be aligned for carriers to resonantly tunnel into/out of the QD.

In particular where a quantum well is incorporated into the source body it is preferable if at least one of its energy levels aligns with a level in the at least one dot.

The quantum dot(s) of the source body may also be surrounded by two quantum wells in order to facilitate tunnelling of both electrons and holes into/out of the quantum dot.

Quantum wells may suitably be formed from a material that can be grown with good material quality within the semiconductor structure. For devices grown from material with a lattice parameter close to GaAs this could be a GaAs quantum well surrounded by AlGaAs, or an InGaAs quantum well surrounded by GaAs. The quantum wells would typically have thicknesses between 5 and 20 nm.

If further quantum dots are incorporated into the source body structure then differing bias levels across the device can allow electrons and holes to reside in a single quantum dot (thereby allowing emission) or can separate carriers of different polarities into different quantum dots thereby reducing the overlap between their wave-functions and preventing radiative recombination.

A further arrangement for the source body is a n-i-schottky structure. Such a device is suitable for operation with optical excitation and the bias across the device can be used to control the number of charges stored on the quantum dot.

In cases where the photon source body comprises a plurality of quantum dots then preferably the source body further comprises means for defining an active region within the source body such that emission is only collected from a dot or a limited number of dots within said active region.

By defining an active region within the body of the photon source, the body of the photon source may be made large enough to ensure that it can be reliably electrically contacted while still allowing emission from a single quantum dot to be selected.

The active region may be defined in terms of a limited collection region, wherein only photons emitted from dots within the active region will be collected and emissions which may occur from other dots will either be blocked or will not be allowed to contribute to the output of the source.

The photon source may further comprise an emission member having a body with an aperture, said aperture being positioned such that emission from dots in the active area is transmitted through said aperture. The emission member may be provided remote from the photon source body or preferably provided adjacent said photon source body.

For example, the emission member may be a collection optic such as fibre-optic cable or lens which is positioned such that it only collects photons emitted from dots within a certain region of the device, the so-called active region. The active region being defined by the position and size of the aperture.

Alternatively, the emission member may be mask or the like which is provided with an aperture, the mask being positioned such that only photons emitted from dots in the active region are transmitted through the aperture, wherein radiation from the other dots is absorbed or reflected by said mask.

The emission member may also be integral with the photon source body. For example, the emission member may be a layer or a plurality of layers within the body of the source. The emission member may even be provided by a layer which has some other function. For example, the electrical contact may shaped to also act as the emission member.

There may be more than one emission member, allowing a number of alternative outputs from the device.

In a further arrangement, the active area may be defined by ion beam damage, such that the lattice surrounding the quantum dots in regions outside the active region is damaged. This results in non-radiative recombination for excitons in the damaged quantum dots, suppressing light emission from them. The consequence is that only the undamaged dots are optically active, and thus emission from a single dot, or small number of dots, can be isolated.

Alternatively, the volume of the optically active body that is injected with carriers may be restricted with an electrically insulating layer (such as Aluminium Oxide). Or a region of the device may be entirely removed by etching to leave a mesa with a volume that is small enough to isolate a small number of quantum dots.

In order to provide high collection efficiency from the photon source, the active region is preferably provided within an optical cavity.

The advantage of using a cavity is that it allows more of the emitted light to be coupled into the numerical aperture of a collecting fibre or optic. The cavity mode of the resonant cavity is emitted into a narrow range of angles around the normal to the mirrors that define the cavity. The fibre/collection optic may be arranged to collect the cavity mode.

If the quantum dots are provided in a layer or plurality of layers, the optical cavity may be provided by reflecting regions on either side of said dot layer.

Preferably, one of the reflecting regions (ideally the reflecting region closest the output surface of the body) is less reflective such that it can transmit the emitted photons. More preferably, the energy of the cavity mode for said cavity is substantially equal to that of the desired emitted photons.

Further, it is preferable if the distance between the two reflecting regions be defined such that light of the desired wavelength that completes a round trip of the cavity suffers a phase change of an integer number of $2\pi$. Furthermore, the QD layer must be positioned at an anti-node in the optical electric field within this cavity.

At least one of the reflecting regions may be a Bragg mirror comprising a plurality of alternating layers where each layer satisfies the relation:

$$n_a t_a = n_b t_b = \lambda/4$$

where one dielectric layer (a) has a refractive index of $n_a$ and a thickness of $t_a$ and second dielectric layer (b) has a refractive index of $n_b$ and a thickness of $t_b$. This mirror will impart a phase change of zero to incident light at the wavelength $\lambda$. It will impart a non-zero phase change to light of other wavelengths.

The Bragg mirrors may be grown in-situ with the semiconductor layer structure, or be formed afterward using semiconductor or dielectric layers (e.g. $TiO_2/SiO_2$).

The Bragg mirrors may be formed by alternating layers such as GaAs/AlOx, GaAs/AlAs, $TiO_2/SiO_2$, $Al_xGa_{1-x}As_ySb_{1-y}/AlAs_ySb_{1-y}$ (where y=0.5 and x=0.1), InP/InGaAsP, $InP/In_{0.52}Al_{0.48}As$, InP/InAlOx. GaAs/AlOx or InP/InAlOx are particularly preferable because of the large refractive index contrast between AlOx and GaAs or InP and InAlOx. (AlOx refers to the family of Aluminium Oxides.) This means that fewer layer repeats are required to produce a high reflectivity mirror. Preferably, the alternating stack will comprise from 2 to 50 periods, more preferably from 2 to 20 periods.

At least one of the mirrors may also comprise a metal layer, such as Gold, Silver or Aluminium. The metal layer may be formed during the epitaxial growth of the semiconductor layers or in a separate step. Such metallic layers impart a non-zero phase change to light they reflect. If this metallic layer is to be used as a mirror it is important to introduce a "phase matching layer" to the semiconductor which compromises the region between the mirrors. Said phase matching layer is of a thickness chosen such that the phase change on traversing the cavity is again an integer number of $2\pi$, and the optically active region is again at an anti-node in the optical electric field. The metal layer may be configured as the above described emission member.

At least one of the mirrors may even be a semiconductor/air or semiconductor/dielectric interface.

If a plurality of quantum dots are provided in the active region, the cavity is preferably designed so that one of a predefined number of the quantum dots has an emission energy, which couples to the cavity mode. This can be used to ensure that emission from only one dot is collected, which is important for ensuring single photon emission.

The spectral width of the cavity mode, $\delta\lambda$, decreases with increasing mirror reflectivity. The reflectivity of a Bragg mirror can be enhanced by increasing the number of periods in the mirror. Hence it is possible to control the quality factor, $\delta\lambda/\lambda$, of the cavity. Even with relatively poor quality-factor cavities (such as those formed between an air/semiconductor and semiconductor/Bragg mirrors) significant improvements in collection efficiency can be obtained. However, the combination of high quality factor cavity and low optical mode volume can be used to demonstrate a reduction in the radiative lifetimes of the emissive states through the Purcell Effect. This effect would offer even higher collection efficiencies and would be advantageous to, but not necessary for, the operation of a device.

The active region may be provided in a three dimensional cavity, such a three dimensional cavity may be produced by a three dimensional variation in the dielectric constant around the quantum dot.

Such a structure may be achieved by a photonic band gap structure within the plane of the layers of a one dimensional cavity to provide confinement in the plane of the layer or layers.

The photonic band gap structure is preferably provided by a plurality of reflective surfaces provided in the plane of said quantum dot layer, the active region being provided at an irregularity in the pattern. The emitted radiation is then emitted either in a narrow cone centred about the normal to the plane of the layers and about the irregularity in the pattern or in the plane of the pattern to another defect.

The pattern of interfaces may take a number of forms. For example, the pattern may be provided on a triangular, rectangular or hexagonal lattice.

These reflective surfaces may be provided by a pattern of holes which extend through said dot layer and the active region being provided at an irregularity in said pattern. The holes may be produced by etching. As the active region is not defined by the holes, the holes may be kept well away from the boundary of the active region and hence any non-radiative centres produced by the etch will not detriment to the performance of the source.

The holes may be empty or filled with a suitable dielectric material. Alternatively, the reflective surfaces could be provided by a plurality of columns formed in the device. The holes or columns are preferably circular in the cross-section. However, rectangular cross-sections or other shapes could also be used. The pattern could also be a series of concentric rings, the 3D cavity being formed at the centre. The period measured along a radius being constant except at the centre.

Generally, it is desirable to generate photons with a wavelength of either 1.3 µm or 1.55 µm as both of these wavelengths are commonly used for fibre optic cables. For a triangular lattice, the holes separation would be in the range 200-2000 nm and the size of the holes would be chosen to remove 20-80% of the surface area. The structure can also be designed to operate at other wavelengths.

The photon source may be configured so that the light is emitted normal to the plane of the layers. However, the device may also be configured such that the light is emitted in the plane of the layer or layers. This can be achieved by reducing the number of repeats of the pattern in the direction in the plane along which light emission is required. The device can be cleaved to provide an output face normal to the described emission direction. Alternatively, a second irregularity can be introduced into the pattern to guide the light away from the first irregularity.

As the cavity is used to enhance emission at a particular wavelength, the cavity may also act as a filter means.

In a second aspect the present invention provides a method of operating a photon source, the photon source comprising at least one quantum dot, the method comprising applying an electrical bias across said source to inject carriers into the at least one quantum dot to allow electrically activated emission from said at least one dot; and changing the state configuration of the charges within the quantum dot after a predetermined time duration.

In a third aspect the present invention provides a method of operating a photon source, the photon source comprising at least one quantum dot, the method comprising applying an electrical bias across said source, optically exciting the source such that carriers are injected into the at least one quantum dot and changing the state configuration of the charges within the quantum dot after a predetermined time duration.

In both the second and third aspects of the present invention the effects of photon "bunching" may be mitigated by applying the electrical bias in a complex electrical pulse sequence where the bias level is set to several different values between optical emission pulses. This helps ensure that the probability of photon emission in a given pulse is independent of whether a photon was emitted in the previous pulse.

Embodiments of the invention will now be described, by way of example only, with reference to the following figures in which

BRIEF DESCRIPTION OF THE DRAWINGS

FIG. 3a shows the same conduction/valence band schematic as FIG. 1a. FIG. 3b shows the conduction and valence band profile at a voltage $V_{tunnel}(<V_0)$.

DETAILED DESCRIPTION

Figure 1:
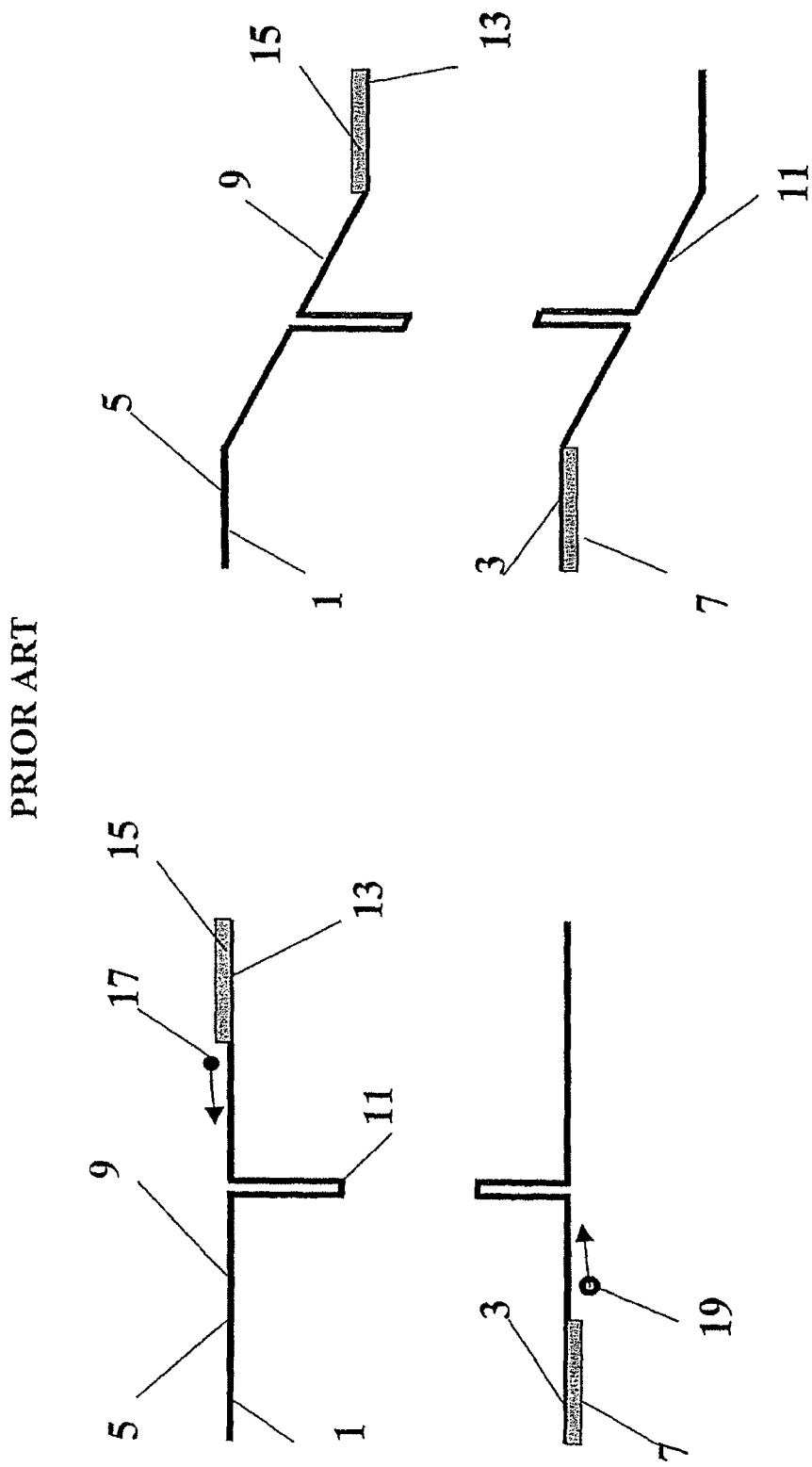
FIG. 1a shows a schematic of the conduction and valence band profiles for a p-i-n type structure with a quantum dot located in the intrinsic region at a positive bias $V_{inject}$.
FIG. 1b illustrates the same conduction and valence band profile at a lower voltage $V_0$.

It should be noted that throughout the following examples like numerals are used to refer to like features.

A simple quantum dot in a p-i-n structure is illustrated in FIG. 1a. FIG. 1a illustrates the conduction band 1 and valence band 3. A p-type region 5 is provided on the left hand side of the structure. In the p-type region 5, there is an excess of holes 7 located in the valence band. The p-type region 5 is connected to intrinsic region 9. Quantum dot 11 is provided in intrinsic region 9. The intrinsic region 9 is connected to n-type region 13 on its opposing side to p-type region 5. Excess electrons 15 are located in the valence band of n-type region 13.

FIG. 1a illustrates the situation when the p-type region 5 is positively biased at $V_{inject}$ with respect to the n-type region. This reduces the potential of the p-type region 5 with respect to the n-type region 13. When the potential of the p-type region 5 approaches that of the n-type region 13, electrons 17 diffuse from reservoir 15 and holes 19 diffuse from p-type reservoir 7. Some of the electrons 17 and holes 19 are captured by quantum dot 11. When an electron and hole are trapped in a single quantum dot, they recombine to emit a photon.

FIG. 1b illustrates the band-structure when a lower voltage $V_0$ is applied. At this lower voltage an internal electric field within the device due to the p-type region 5 and n-type region 13 results in p-type region 5 being at a higher potential than the n-type region. Now carriers cannot be injected to the active region. It has previously been shown that when switching between the two conditions shown in FIGS. 1a and 1b it is possible to switch on and off the injection of carriers into the quantum dot faster than the radiative lifetime of the optically active state. This results in there only being one photon emitted per cycle from the quantum dot exciton state.

FIGS. 1a and 1b correspond to prior art devices and their operation, see for example our co-pending application GB2380605.

Figure 2:
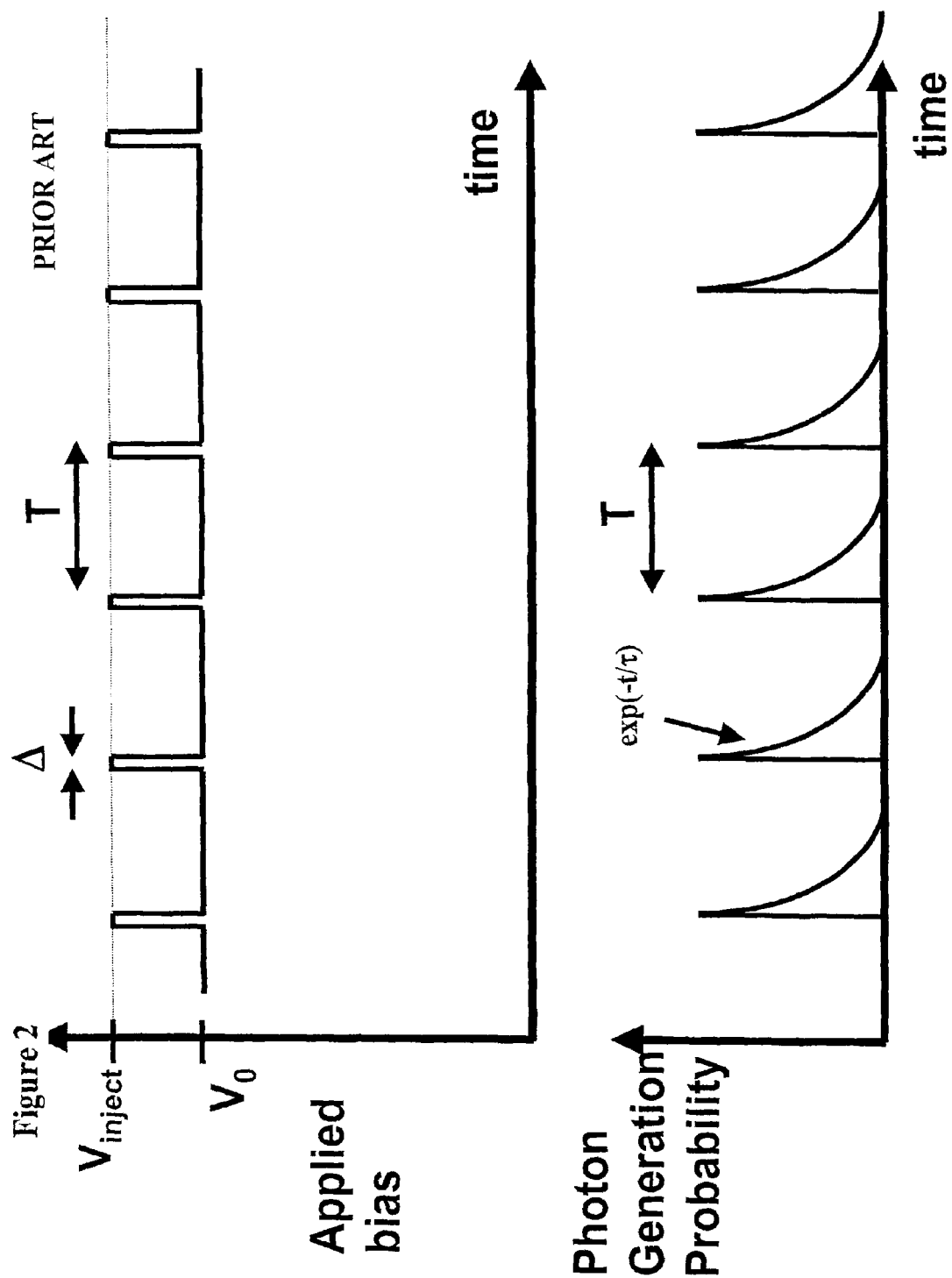
FIG. 2 shows a schematic plot of a pulsed bias which may be used to operate the device of FIG. 1.

FIG. 2 shows a schematic plot of a pulsed bias which may be used to operate the device of FIG. 1 (see Yuan et al Science 295 p 102-105 (2002)) which investigates this mode of operation for electrically driven single photon sources). In FIG. 2 the bias is switched between a lower level of $V_0$ (which corresponds to a level just below the device threshold voltage required to inject carriers into the quantum dot—also illustrated in FIG. 1b) and a higher level of $V_{inject}$ (where carriers are transferred to the active region of the device—as shown in FIG. 1a). When each voltage pulse ends the bias returns to $V_0$ and the charges remain in the quantum dot. These charges then recombine and an exponentially falling signal intensity is observed characterised by the radiative decay time, $\tau$. The pulse width of the bias signal is $\Delta$ and the period between pulses is T.

This exponential decay time limits the speed at which the device can be operated and allows time for decoherence processes to occur. These decoherence processes occur randomly and may lead to a change in the energy/phase of the state which allows an observer to distinguish between photons emitted during different pulses.

Figure 3:
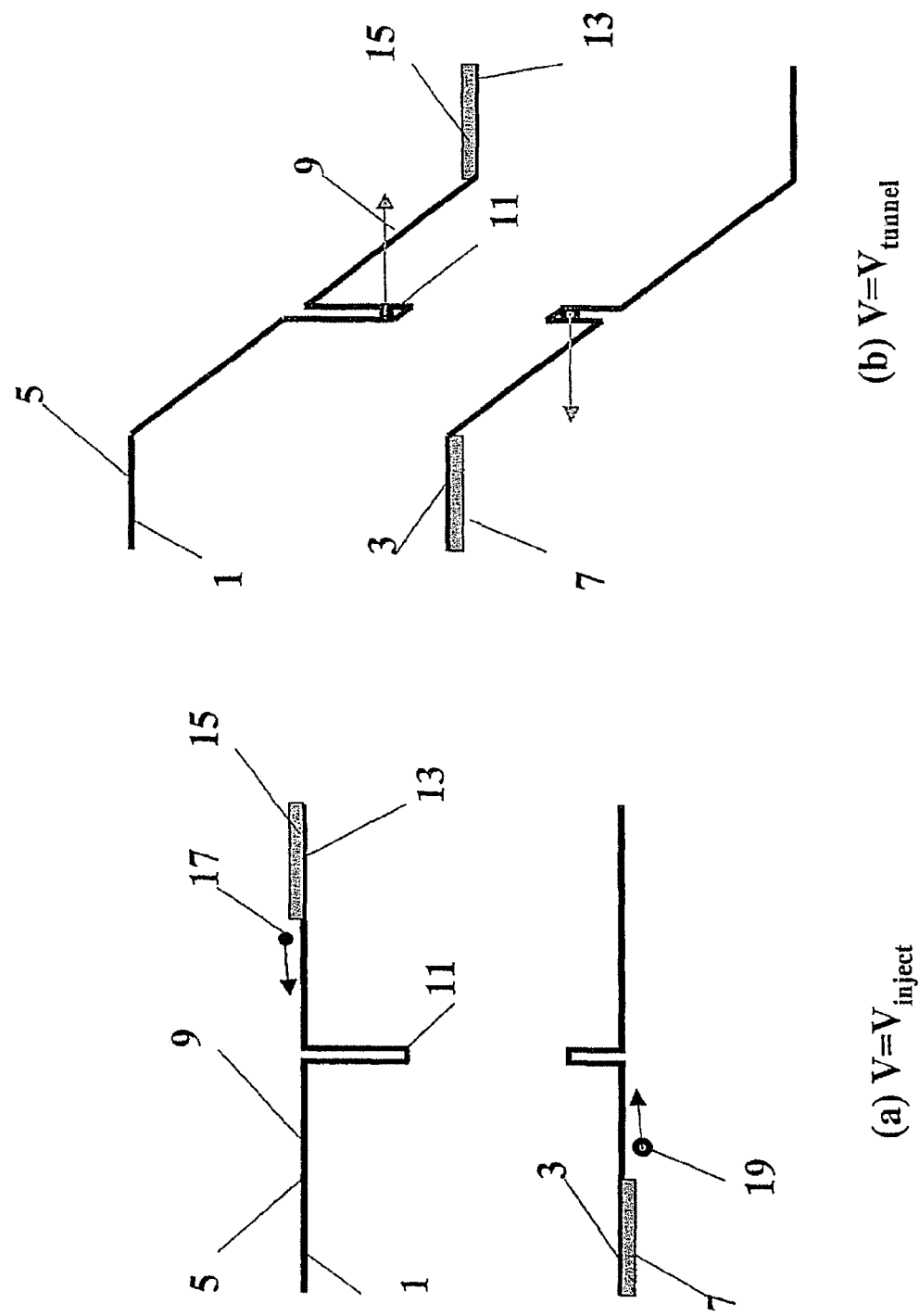

Devices operated in accordance with the present invention are shown in FIG. 3 onwards.

FIG. 3a shows a conduction and valence band profile similar to that depicted in FIG. 1a. However, in FIG. 3b the bias applied by the device has been set to $V_{tunnel}$ (where $V_{tunnel} < V_0$) such that it is now possible for carriers of either or both signs to tunnel to or from the quantum dot. Thus, in operation, when the bias is $V_{tunnel}$ the quantum dot is switched into a different state. This state switching may be achieved by the addition or removal of carriers of either sign.

Figure 4:
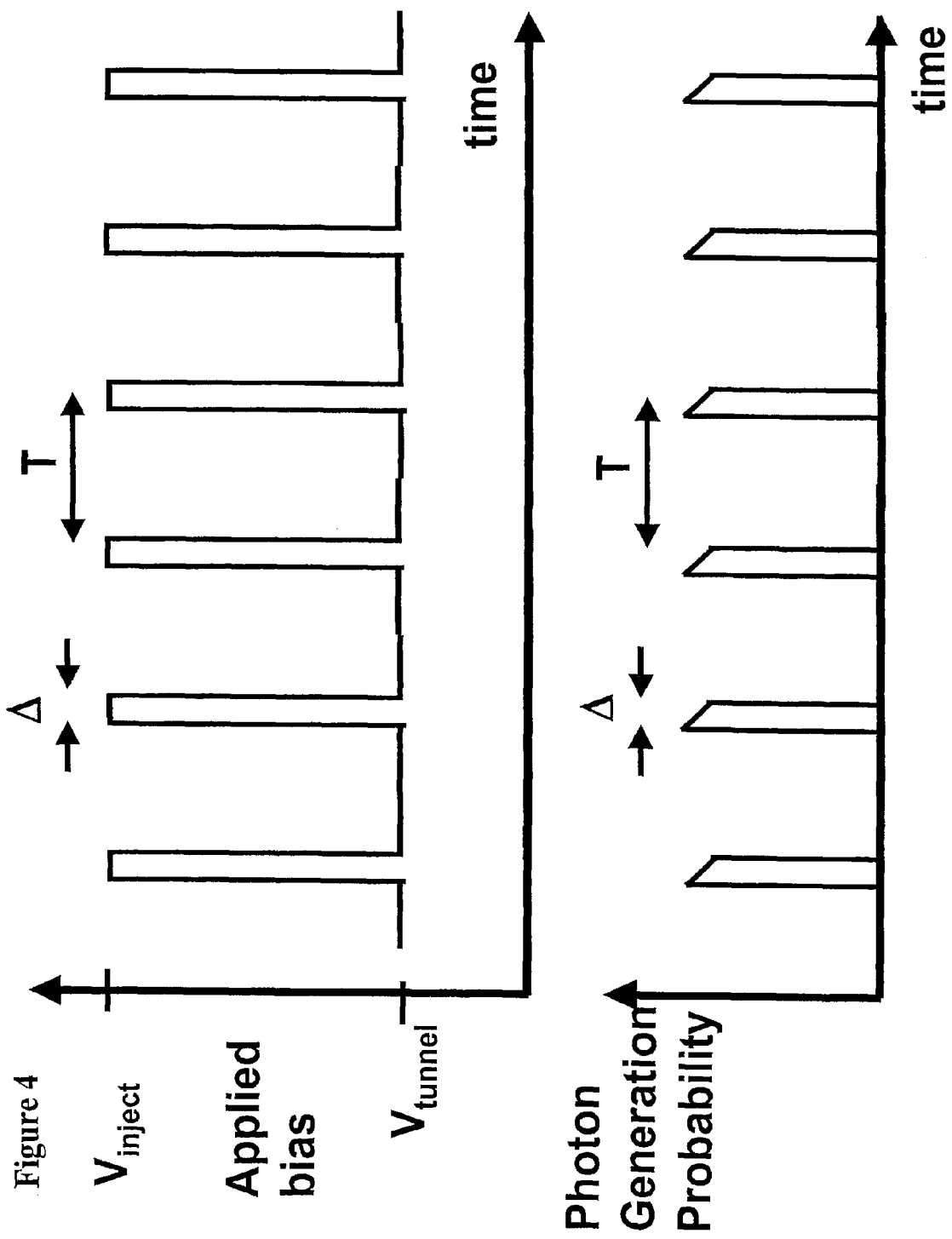
FIG. 4 shows a schematic plot of an electrical pulse sequence to operate the device of FIG. 3.

FIG. 4 shows an electrical pulse sequence that can be used to operate a device in the manner depicted in FIG. 3. In FIG. 4 the bias is switched between a lower level of $V_{tunnel}$ (which corresponds to a level at which either or both of the carriers can tunnel to or from the quantum dot) and the higher level of $V_{inject}$ (where carriers are transferred to the active region of the device—as shown in FIG. 3a). When each voltage pulse ends the bias returns to $V_{tunnel}$ and the state of the charges in the quantum dot changes.

The essential point is that now when the voltage is switched to $V_{tunnel}$ the state of the carriers in the quantum dot will change. Emission will not occur at the same wavelength, if at all, so the time-window in which photons are collected is reduced to the length of the electrical pulse. This is in contrast to what is demonstrated in FIG. 2.

The state that the voltage $V_{tunnel}$ switches the carriers into could be "empty" in which case the voltage $V_{tunnel}$ must be set at a level at which both positive and negative charges are removed from the quantum dot.

$V_{tunnel}$ could also be chosen to switch the quantum dot into some other configuration such as a charged state (by addition or removal of charges of either sign to the quantum dot). Alternatively, $V_{tunnel}$ could switch the quantum dot into an optically "dark" state or it could spatially separate carriers by a distance where their wave functions do not substantially overlap.

Figure 5:
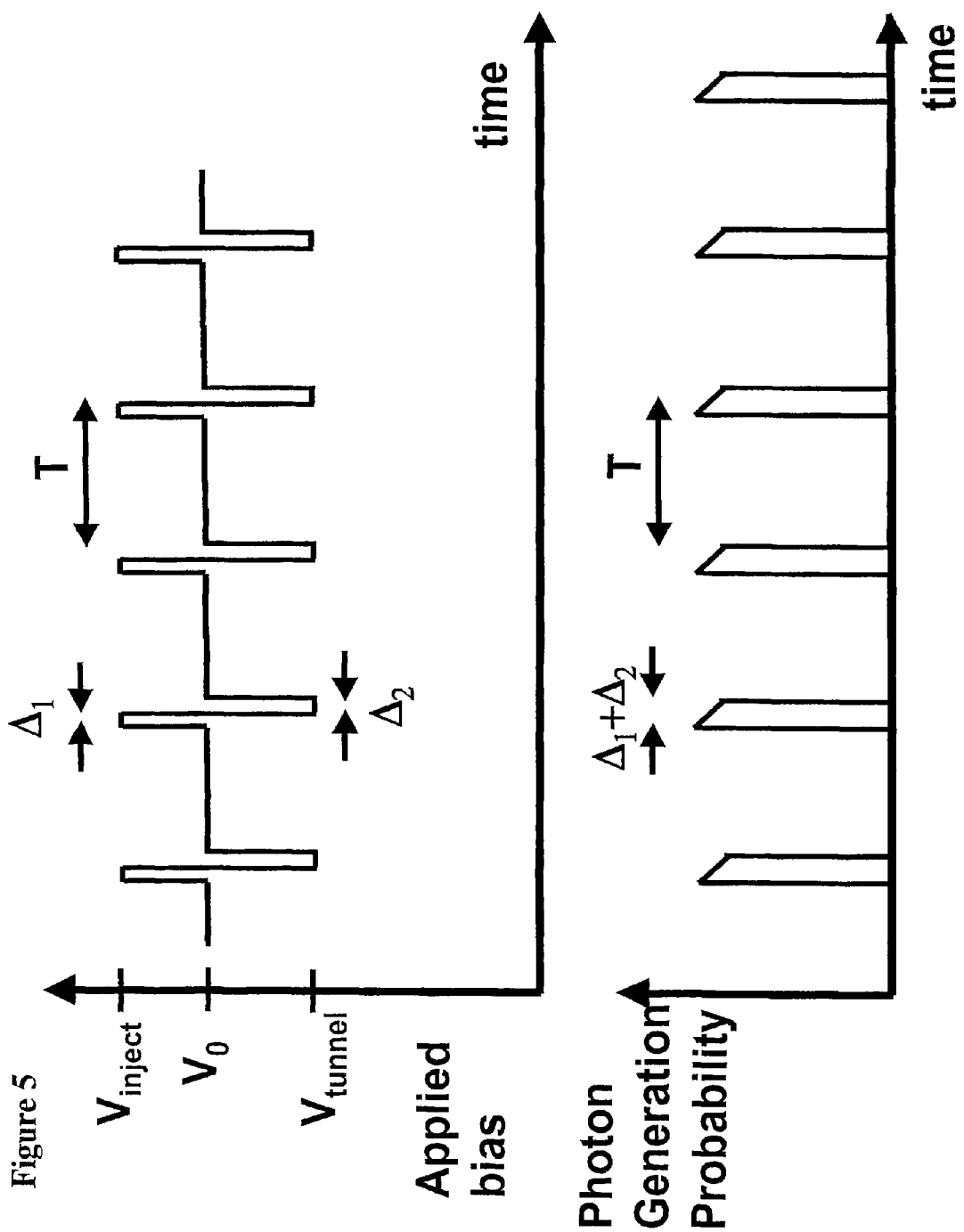
FIG. 5 shows a schematic plot of a further electrical pulse sequence to operate a device in accordance with an embodiment of the present invention.

FIG. 5 shows an alternative electrical pulse sequence that could be used to operate a device in the manner depicted in FIG. 3. In this Figure the applied bias is switched between three different levels, $V_{tunnel}$, $V_{inject}$ and $V_0$. The bias is first set to $V_{inject}$ in order to inject carriers. Then the voltage is set to $V_{tunnel}$ in order to transfer the charges in the quantum dot to a new state. The device is then set to a third voltage, $V_0$ (a bias level which is just below the device threshold voltage required to inject carriers into the quantum dot).

The pulse width of the $V_0$-$V_{inject}$-$V_0$ pulse (the "positive pulse") is $\Delta_1$ and the pulse width of the $V_0$-$V_{tunnel}$-$V_0$ pulse (the "negative pulse") is $\Delta_2$. The period of the pulse sequence is again T. It is possible for the negative pulse to be of any length up to (T-$\Delta_1$).

Further electrical pulse sequences are possible. For example, two tunnel voltages ($V_{1tunnel}$, $V_{2tunnel}$) may be used in order to remove both the electrons and the holes from the quantum dot.

The output of a photon source as described above can be analysed by using an autocorrelation measurement technique in which the value of the product of the source output with a time-shifted version of itself is determined. It is noted that if the state of the quantum dot at the start of each pulse is different depending on whether a photon has been or has not been emitted in the previous pulse then "bunching" or "antibunching" of photons may appear in the autocorrelation measurement.

Put simply, photon emission in one pulse may favour/disfavour the creation of a photon in the next pulse increasing/decreasing the probability of 2 photons being created in adjacent pulses. This has a detrimental effect on the device efficiency. There are several techniques that can be employed to reduce this possibility, the most obvious of which is emptying the quantum dot between pulses (for instance using the same pulse sequence as shown in FIG. 4 but reducing $V_{tunnel}$ to the point where all carriers are removed between pulses). The negative-height voltage pulses shown in FIG. 5 could also be chosen to perform the same purpose.

Again, more complex pulse sequences may be required where $V_{tunnel}$ is set to several different levels between pulses so as to ensure that the probability of photon emission in a given pulse is independent of whether a photon was emitted in the previous pulse.

The discussion thus far has general applicability to devices where the transfer of carriers to/from the quantum dot is achieved by resonant or non-resonant injection. Several device concepts which may facilitate the switching of the state of charges within the quantum dot will now be described.

Figure 6:
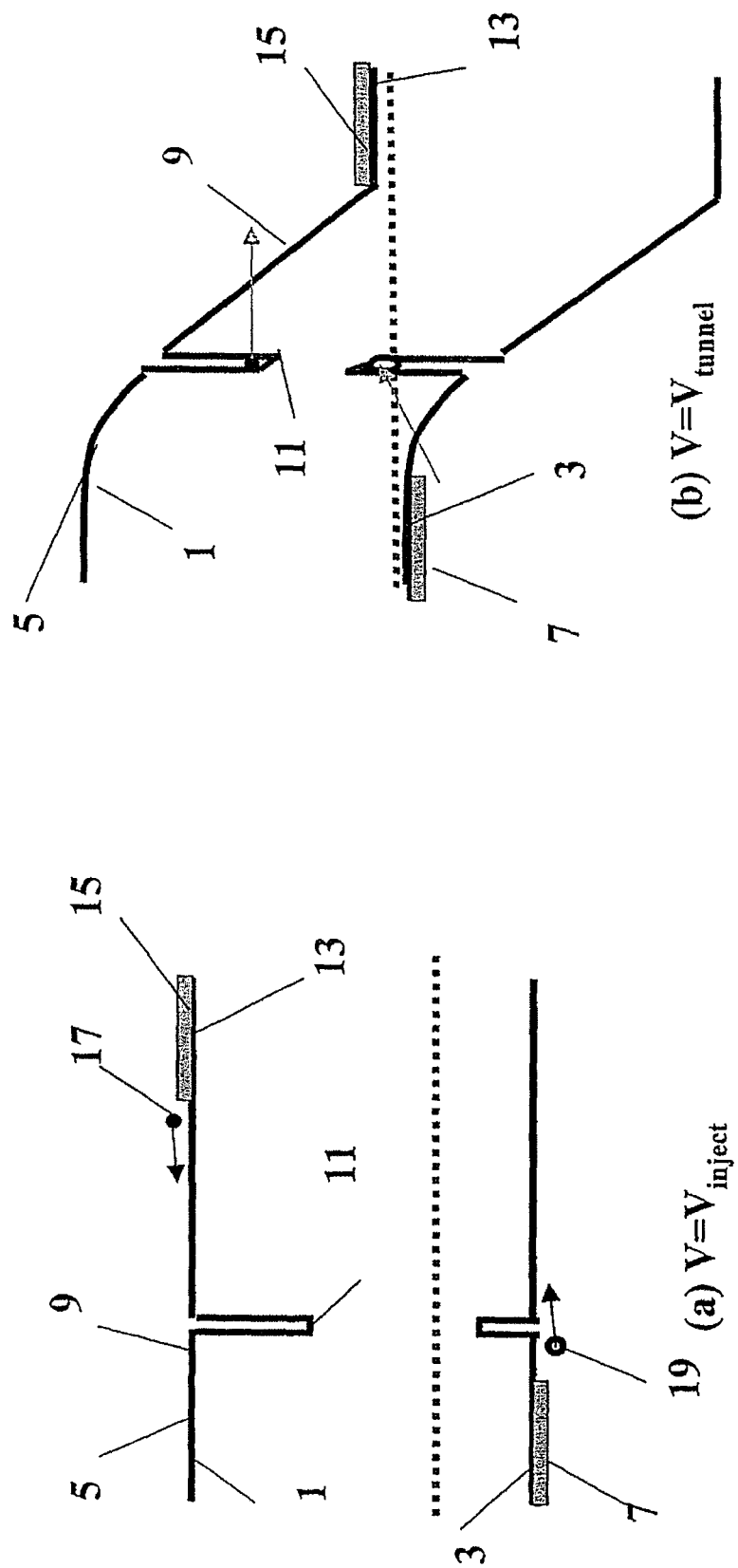
FIG. 6a shows a schematic of the conduction and valence band profiles for a p-i-n type structure with the hole states lying at an energy below the Fermi energy at a positive bias $V_{inject}$.
FIG. 6b shows the same conduction and valence band profile at a bias of $V_{tunnel}$ at which there are valence band states in the QD that lie above the Fermi energy.

FIG. 6a shows a conduction and valence band profile of a p-i-n structure where the optically active quantum dot has a hole energy level below that of the Fermi energy level at bias voltage $V_{inject}$. At this voltage the device is near a flat-band condition such that the quantum dot is occupied by an equal number of electrons and holes leading to emission at the desired wavelength.

In FIG. 6b the bias voltage is reduced to $V_{tunnel}$. Electrons 17 are now able to tunnel out of the quantum dot 11. However, the bias voltage has been set such that the Fermi energy level in the region of the quantum dot is such that positive carriers are allowed to build up. This results in a build up of positively charged carriers in the quantum dot and this state of the quantum dot will not emit at the same wavelength as the optically active state under investigation—hence the state of the quantum dot has been "switched".

Equally, the quantum dot energy levels and Fermi energy in the region of the QD could be designed such that at $V_{tunnel}$ the QD fills electrons.

Figure 7:
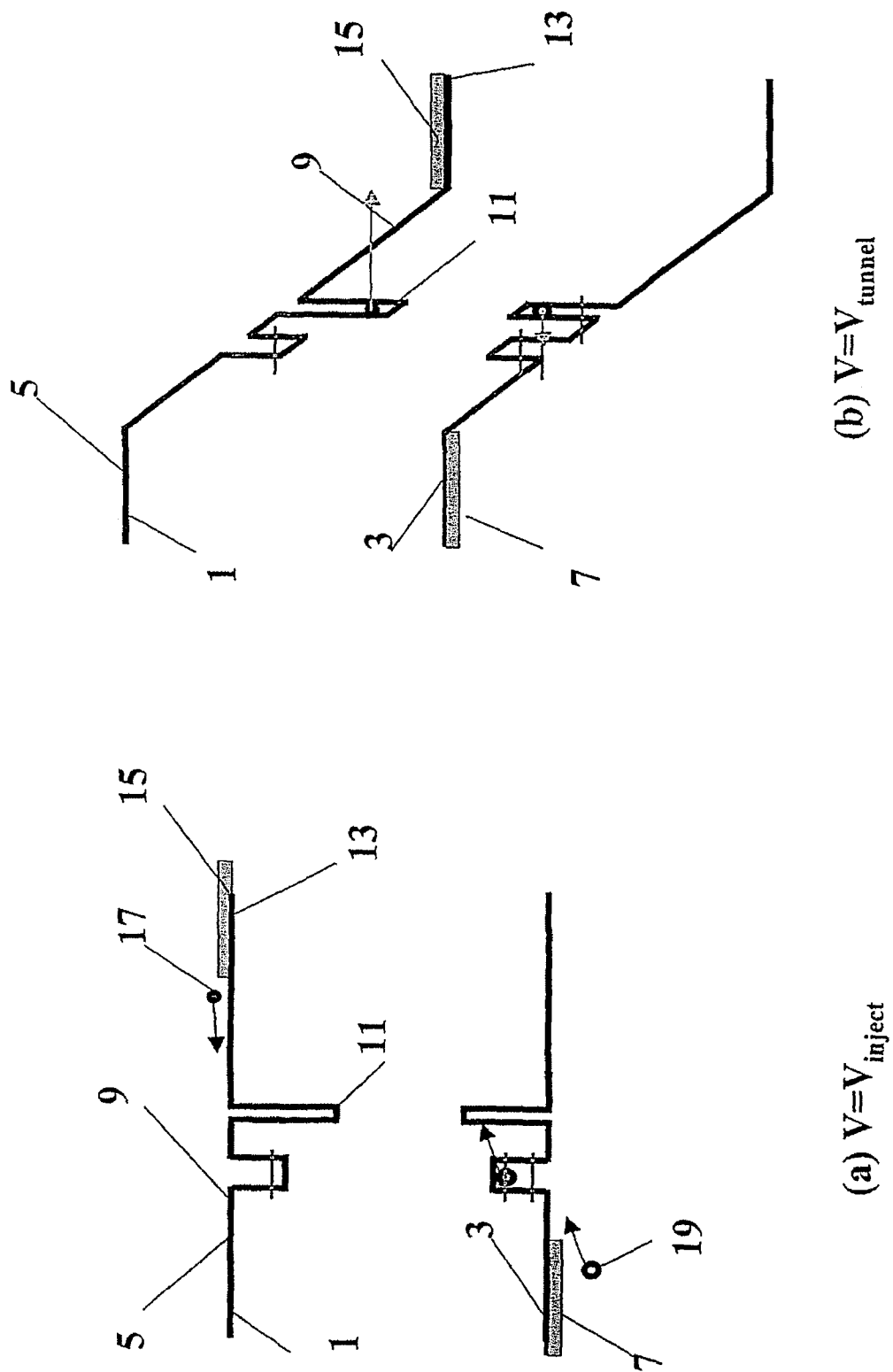
FIG. 7a shows a schematic of the conduction and valence band profiles for a p-i-n structure with a quantum dot located in the intrinsic region and a quantum well located between the quantum dot and the p-doped layer at a bias of $V_{inject}$.
FIG. 7b shows the same conduction and valence profile at a bias of $V_{tunnel}$.

FIG. 7 shows a schematic of the conduction and valence band profiles for a p-i-n structure with a quantum dot located in the intrinsic region and a quantum well located between the quantum dot and the p-doped layer. In FIG. 7a a bias voltage of $V_{inject}$ has been applied and the quantum well layer such that holes can resonantly tunnel to the quantum dot (this tunnelling occurs when a quantised level of the quantum well is at the same energy as a quantised level of the quantum dot).

Although hole tunnelling is depicted here the structure may equally be designed such that electrons can resonantly tunnel to/from the quantum dot.

The quantum well can be formed from AlGaAs in GaAs or InGaAs in GaAs. Alternatively any material system that can be used in close proximity to the quantum dot and maintain material quality can be used. The advantage of the use of a quantum well-quantum dot structure is that the states of the quantum well are quantised and can be designed with appropriate material composition and well thickness to be aligned at energies close to those of the quantum dot.

In FIG. 7b the bias has been set to a second voltage ($V_{tunnel}$) and a different energy level of the quantum well has aligned with that of the quantum dot leading, in this case, to resonant tunnelling of the hole from the dot to the well. The electron has tunnelled directly out of the dot into the n-contact region.

With a correctly designed quantum well it can also be possible for both carriers to tunnel into the quantum well.

In use, multiple $V_{tunnel}$ and $V_{inject}$ levels may be required with each cycle of operation in order to add/remove both electrons and holes to the device.

The preferred mode of operation in that in which both electrons and holes are resonantly tunnelled into the desired quantum dot states (and no others) since this will reduce the decoherence processes affecting the quantum state of the quantum dot, which would be advantageous to the generation of indistinguishable and entangled photons.

Figure 8:
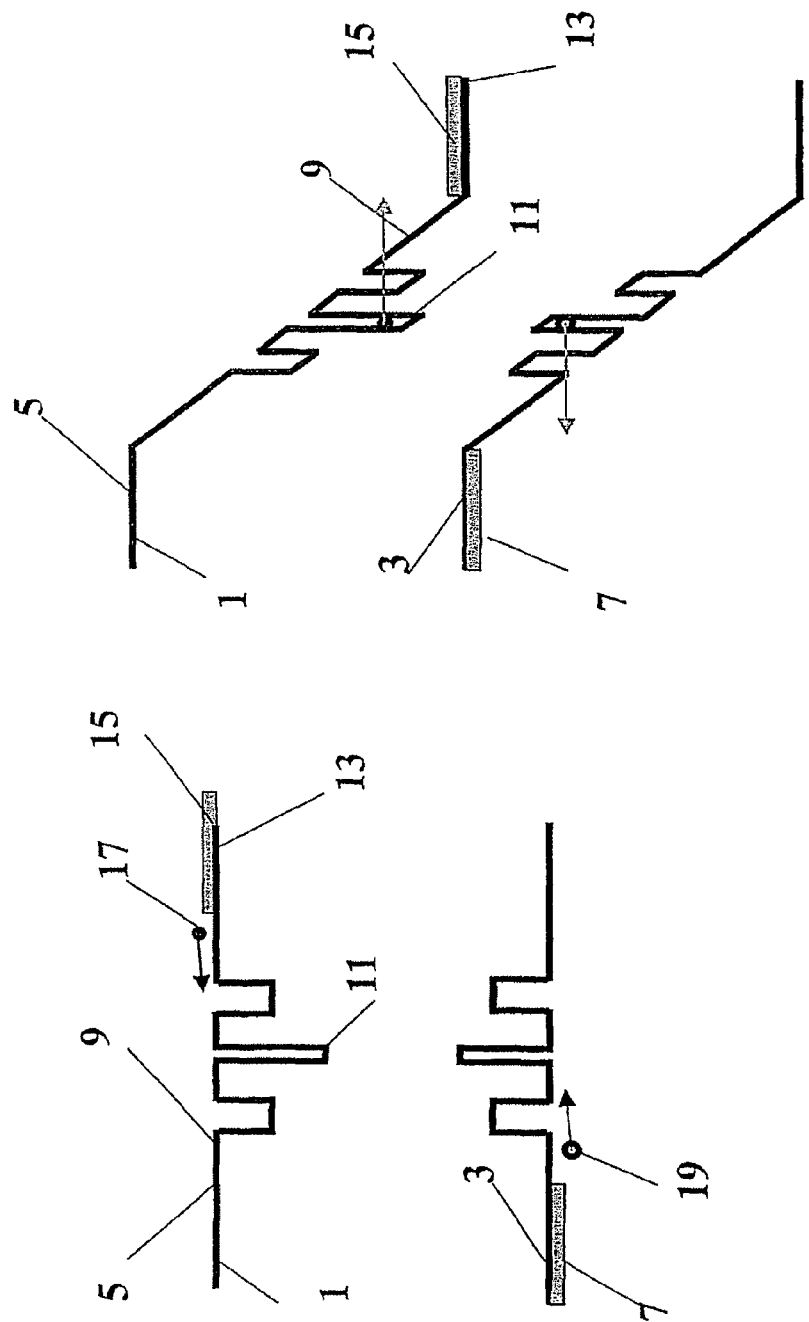
FIG. 8 shows a schematic of a device similar to that depicted in FIG. 7 in which the quantum dot is surrounded by two quantum wells.

In FIG. 8 a device comprising a quantum dot and two quantum wells is shown. There is a quantum well either side of the quantum dot. The presence of two wells facilitates resonant tunnelling of both electrons and holes into/out of the quantum dot.

Figure 9:
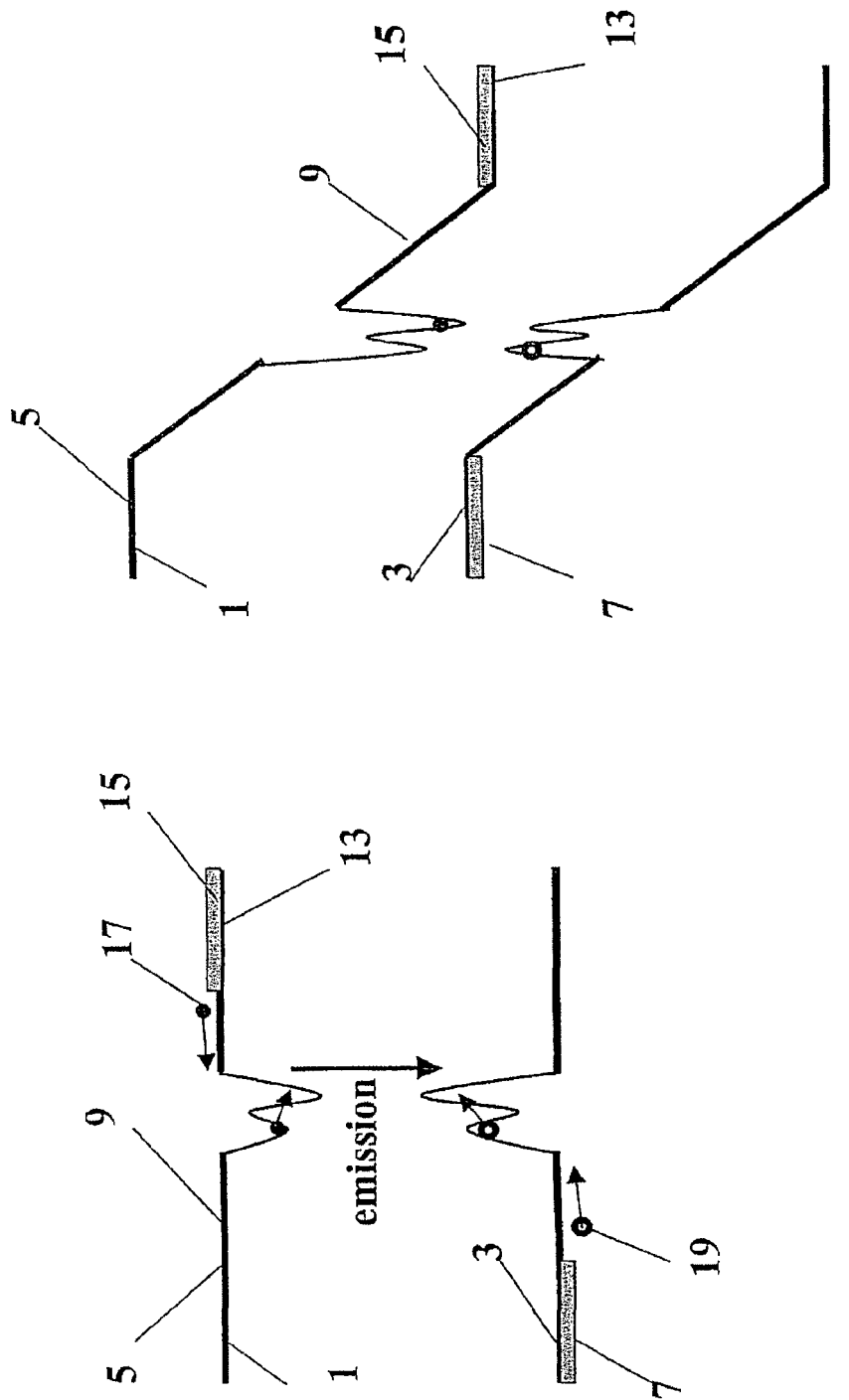
FIG. 9 shows a further variation on FIG. 7 in which the quantum well is replaced by a second quantum dot.

FIG. 9 shows a further variation on FIG. 7 in which the quantum well has been replaced by a second quantum dot. In FIG. 9a a voltage $V_{inject}$ is applied across the device to inject electrons and holes into a single quantum dot. At this voltage electrons and holes can reside within the same quantum dot and radiative recombination can occur. In FIG. 9b a voltage $V_{tunnel}$ is applied and an electric field across the device separates the electrons and holes into the two different quantum dots, thereby reducing the overlap of their wave-functions and preventing radiative recombination This structure could be manufactured using the self-alignment of quantum dots in closely stacked layers. It is well known that with GaAs spacer layers of less then 400 nm thickness between the quantum dots the strain field of the quantum dots in the first layer promotes formation of quantum dots in the next layer. This can result in quantum dots of different size/shape/composition. Although the example here refers to a pair of quantum dots this could be generalised to a "chain" of many quantum dots in several layers.

Figure 10:
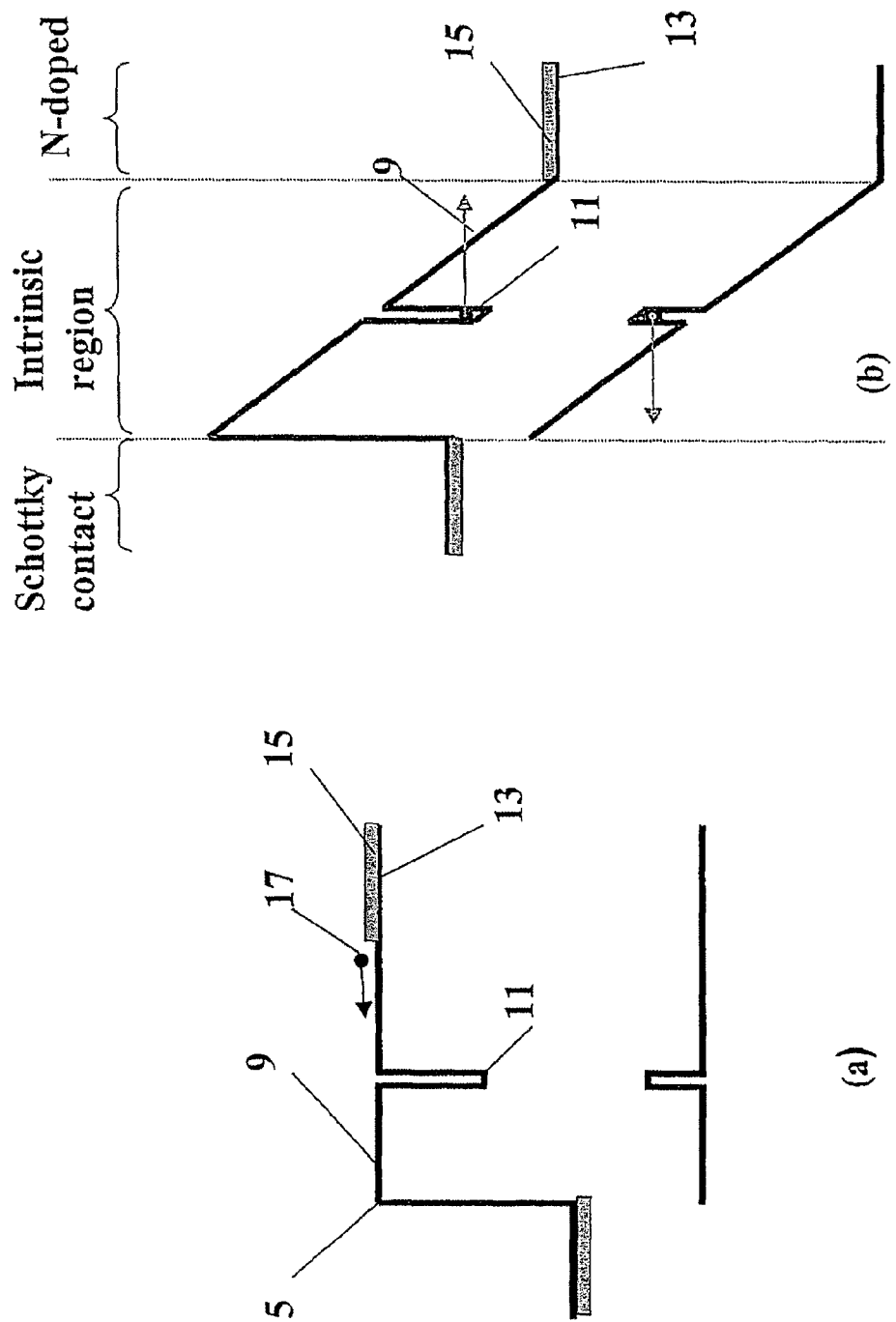
FIG. 10a shows a schematic of the conduction and valence band profiles for a n-i-schottky diode structure at a bias of $V_0$.
FIG. 10b shows the same profile at a bias of $V_{tunnel}$.

FIG. 10 shows a schematic of the conduction and valence band profiles for a n-i-schottky structure with a quantum dot located in the intrinsic region. A potential drop exists between the metal contact and the semiconductor region.

Carriers must be injected optically to the structure shown in FIG. 10. In all previous structures discussed carriers can be injected both electrically and optically. FIG. 10 shows a schematic of the operation of the device under pulsed optical excitation.

Figure 11:
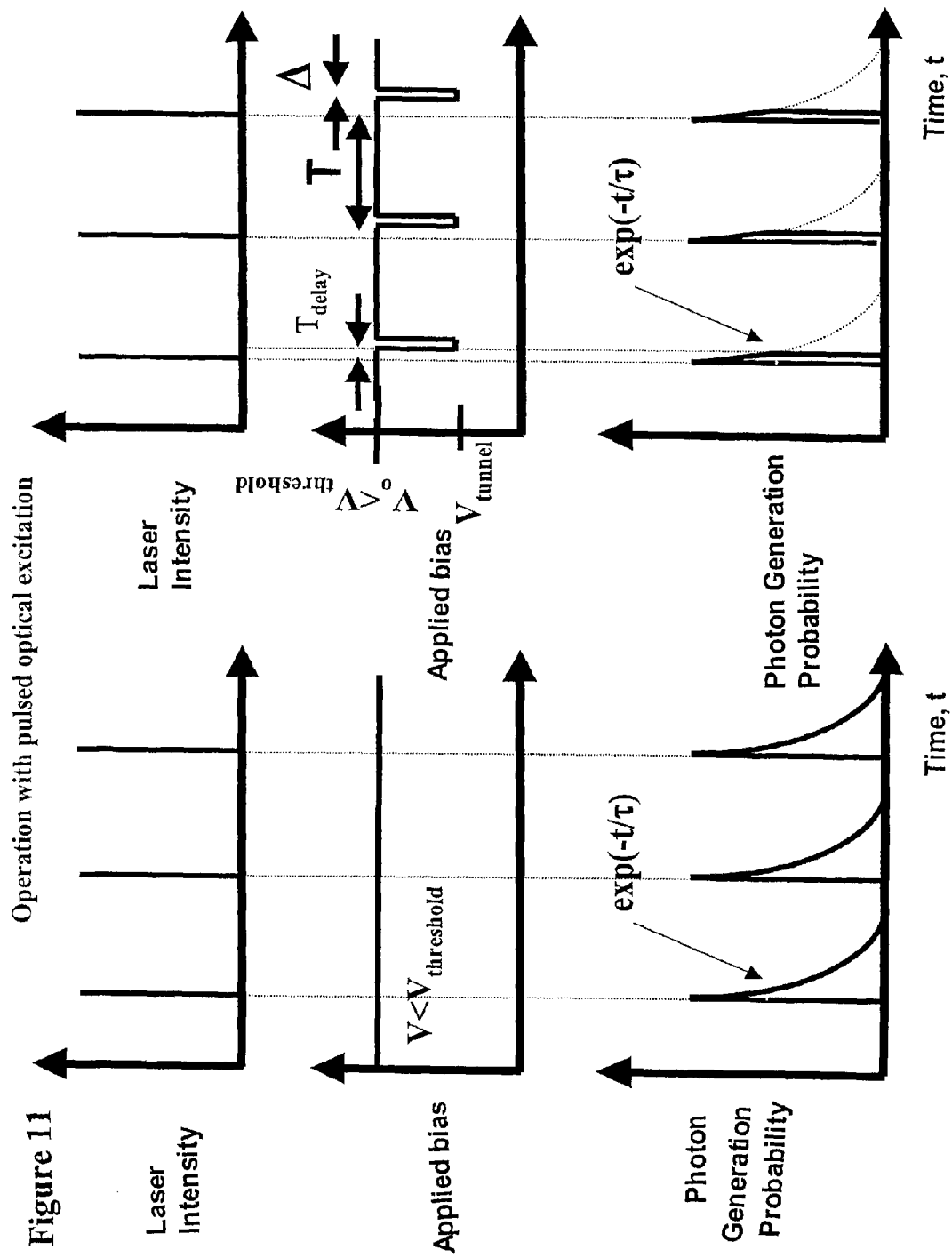
FIG. 11 shows a schematic plot of the operation of a device with pulsed optical excitation under two different applied bias regimes.

The laser intensity/bias/photon generation probability plots on the left hand side of FIG. 11 represent the operation of the device according to prior art systems. In this case the device is held at a fixed bias $V_0$ (which is less than the threshold voltage required to inject carriers into the quantum dot) and each optical pulse populates the quantum dot with carriers (electrons and holes) which are permitted to stay within the dot. The carriers decay freely after each optical pulse and the photon generation probability is determined by the radiative decay time, $\tau$. The photon generation probability varies with time as $\exp(-t/\tau)$ after the carriers have been injected.

In contrast the laser intensity/bias/photon generation probability plots on the right hand side of FIG. 11 represent the operation of the device according to the present invention. In this case the quantum dot is again populated by optical excitation. Following a time delay, $T_{delay}$, the bias across the structure is reduced to $V_{tunnel}$ in order to change the state of charges within the quantum dot. As in FIG. 3, the emission window is truncated and emission only occurs during the period between optical excitation and the lowering of the bias voltage, i.e. during the period corresponding to $T_{delay}$.

Figure 12:
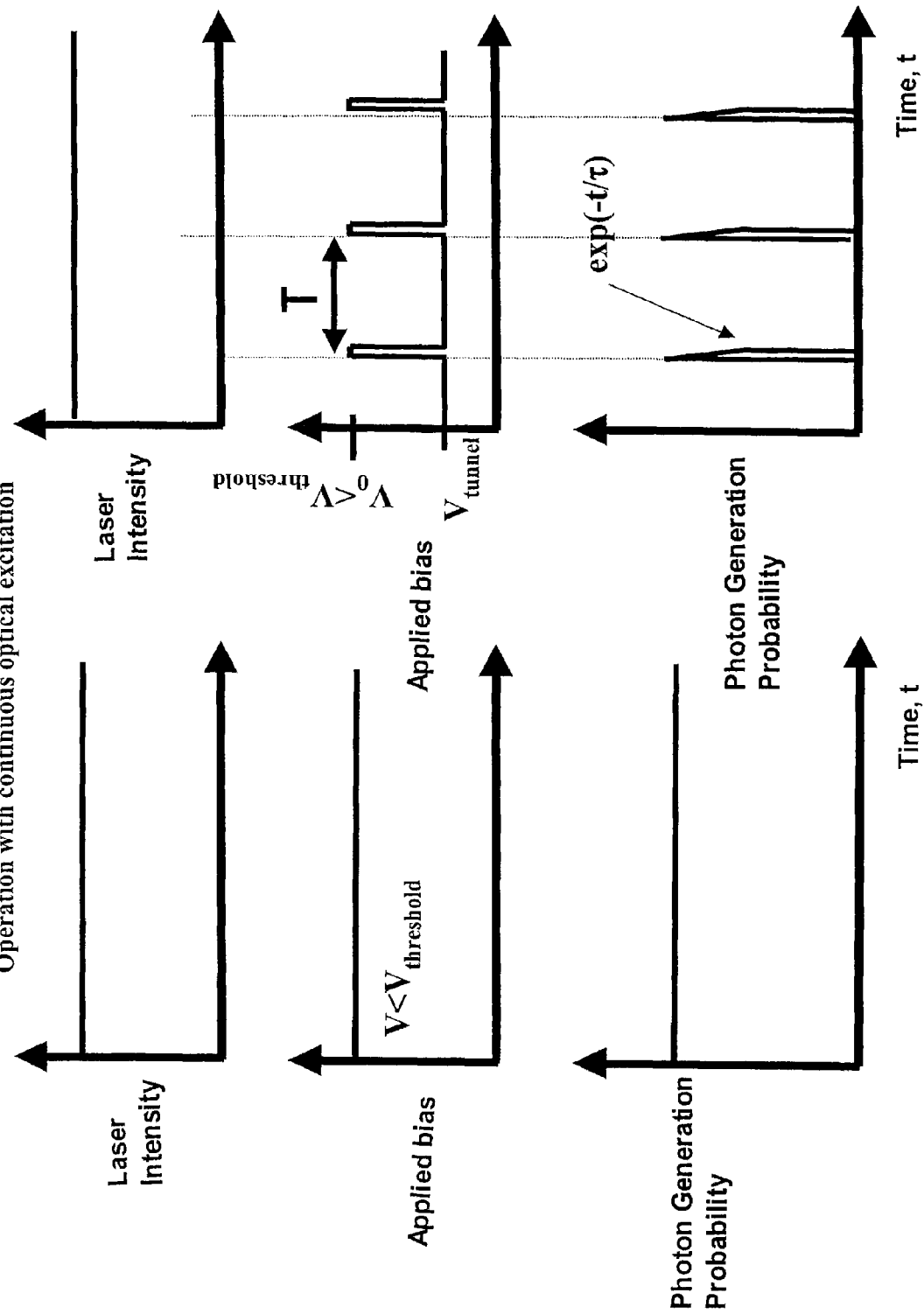
FIG. 12 shows a schematic plot of the operation of a device with continuous optical excitation under two different applied bias regimes.

FIG. 12 shows a schematic of the operation of the structure of FIG. 10 under continuous optical excitation. Again the left hand side relates to the prior art mode of operation and the right hand side operation according to the present invention.

On the left hand side the device is biased at a fixed level $V_0$ and there is equal probability of the photons being emitted at any time. On the right hand side the device is held at $V_{tunnel}$ and is operated with voltage pulses ($V_0$) such that emission only occurs within short time windows defined by the length of time the device is held at bias $V_0$.

Figure 13:
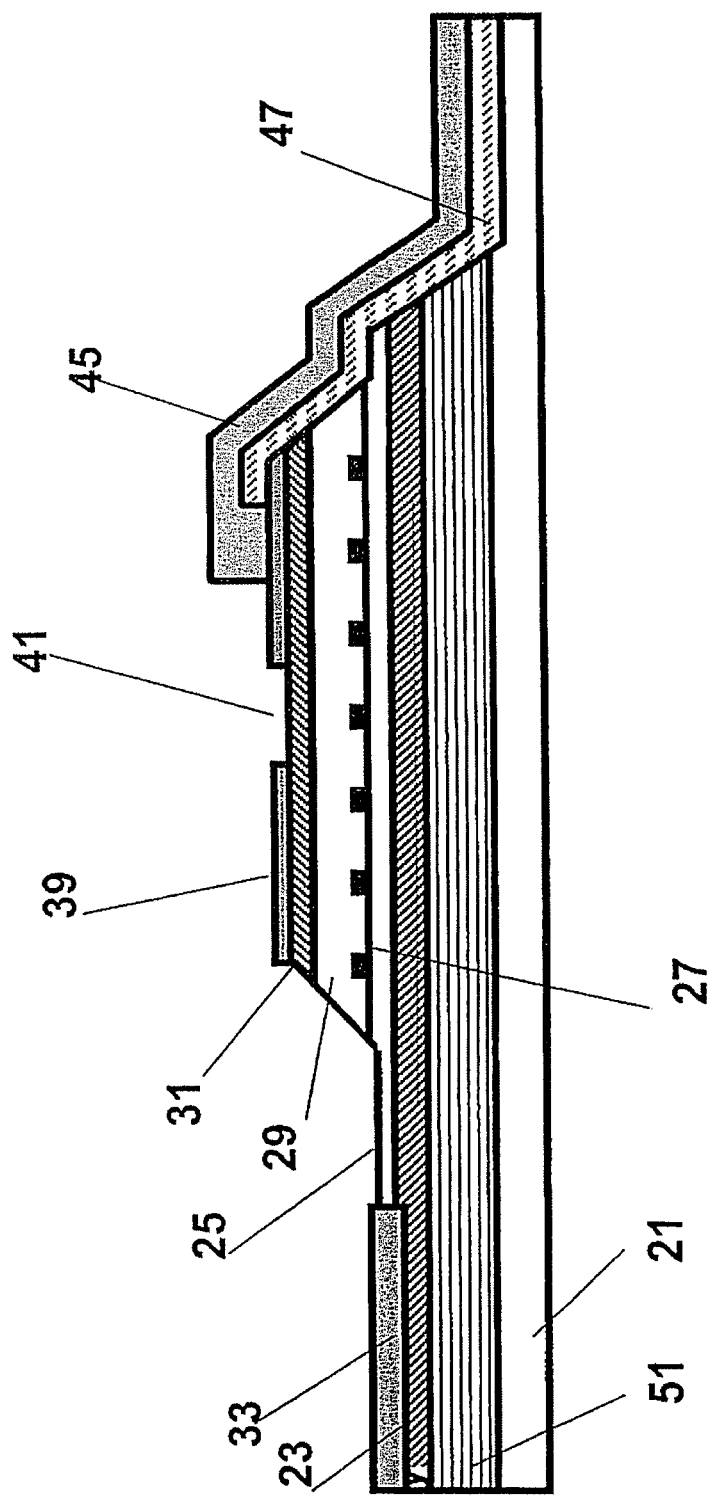
FIG. 13 illustrates a source in accordance with the present invention

FIG. 13 illustrates a source in accordance with the present invention. A GaAs buffer layer 21 is formed overlying and in contact with a semi-insulating GaAs substrate (not shown). A lower n-doped Bragg mirror 51 is then provided overlying and in contact with said buffer layer 21. Said lower Bragg mirror comprises multiple pairs of alternating layer of AlGaAs and GaAs quarter wavelength thick layers.

An n-type layer 23 is then formed overlying and in contact with said lower Bragg mirror 51. An intrinsic GaAs undoped layer 25 is then formed overlying and in contact with said n layer 23.

InAs dot layer 27 is then formed overlying and in contact with intrinsic layer. Approximately 1.8 monolayers of InAs are used to form the dot layer if emission is to be near 900 nm. Alternative designs are available for obtaining single quantum dot emission at the technologically significant wavelength of 1300 nm.

A second intrinsic GaAs undoped layer 29 is then formed overlying and in contact with said quantum dot layer.

P type layer 31 is then formed overlying and in contact with said second intrinsic undoped layer 29.

In the above structure, the dot layer 27 is provided within a two dimensional optical cavity defined by lower Bragg mirror 51 and upper air/GaAs interface layer. A metal layer 39 acts as mask to isolate a small number of quantum dots and may also be used to inject carriers to the light emitting region. An Al mask layer 39 can be used to provide ohmic contact. This is because an epitaxially grown Al film can make a good ohmic contact to n and p GaAs. The Al layer can be patterned with micron-sized apertures to isolate emission from single quantum dots. An additional n-type ohmic contact 33 is formed overlying n-type layer 23.

It is desired that the thicknesses of the above layers be chosen such that light of the desired wavelength obtain a phase change of an integer multiple of 2*pi on a round trip of the cavity. Furthermore, the quantum dot layer should then be positioned at an antinode in the optical field within the cavity. For example the 940 nm operation the quantum dot layer could be positioned one optical wavelength (940 nm/3.5-268.5 nm) from the final GaAs/AlGaAs interface in the 940 nm Bragg mirror and 2 optical wavelengths (537.1 nm) from the upper air/GaAs interface.

The quantum dot is located within a resonant cavity which acts as a wavelength filter. Matching the wavelength of the cavity mode to the wavelength of the desired excitonic transition enhances the efficiency with which emission is collected from the desired emission and reduces the apparent intensity of emission from other lines from the same dot (and the emission of other dots). The resonant cavity may also act to enhance the radiative recombination rate (i.e. reduce the radiative lifetime, $\tau$) of emission lines within the bandwidth of the cavity and suppress decay rate from other lines.

In this arrangement, only the resonant wavelength is emitted into a narrow core normal to the sample. Increasing the reflectivity of the mirrors bounding the cavity leads to a narrower cavity mode. This is because the band pass of the structure, which can be thought of as arising from the lifetime of a photon in the cavity, is largely determined by the reflectivity of these two layers. Increasing the reflectivity of the mirrors is therefore advantageous. However, even if the top mirror is of relatively low reflectivity (30% for the air/GaAs interface) there can be a significant improvement in the efficiency with which photons can be collected.

The source may also be fabricated from other material systems. For example, it is possible to form the device on an InP substrate, which is better suited for emission at longer wavelengths. In the following example, the optical cavity is designed for operation at 1.55 μm.

External electrical connection is made to the top of the structure using a contact metal layer which leads to large area contact pads. To prevent the contact metal 45 from shorting the exposed layers on the sides of the source body, the contact metal layer 45 is provided overlying an insulating layer 47.

Operation of the device follows the principle of that described with reference to FIG. 3. By positively biasing the p-type layer 31 with respect to the n-type layer 23, it is possible to diffuse electrons from the n-type layer 23 towards the p-type layer 31 and holes from the p-type layer 31 towards the n-type layer 23. Some of these electrons and holes will be trapped in the quantum dot 27. Upon recombination of the electron and hole a photon is emitted.

The bias between the p-type and n-type layers is then reduced to a level (to $V_{tunnel}$) such that the state of the electrons and holes remaining in the dot is changed. Emission will not occur at the same wavelength, if at all, and therefore the jitter on the average time of photon emission is reduced (as compared to prior art systems).

This device has a plurality of quantum dots. However, due to the formation of the opaque mask 39 with its small emission aperture 41, only the dots directly underneath the aperture 41 can emit photons which are collected. The aperture 41 therefore defines an "active region" of the device. Dots outside the active region may emit photons but these will be blocked by mask 39 and cannot contribute to the signal emitted from the device.

Figure 14:
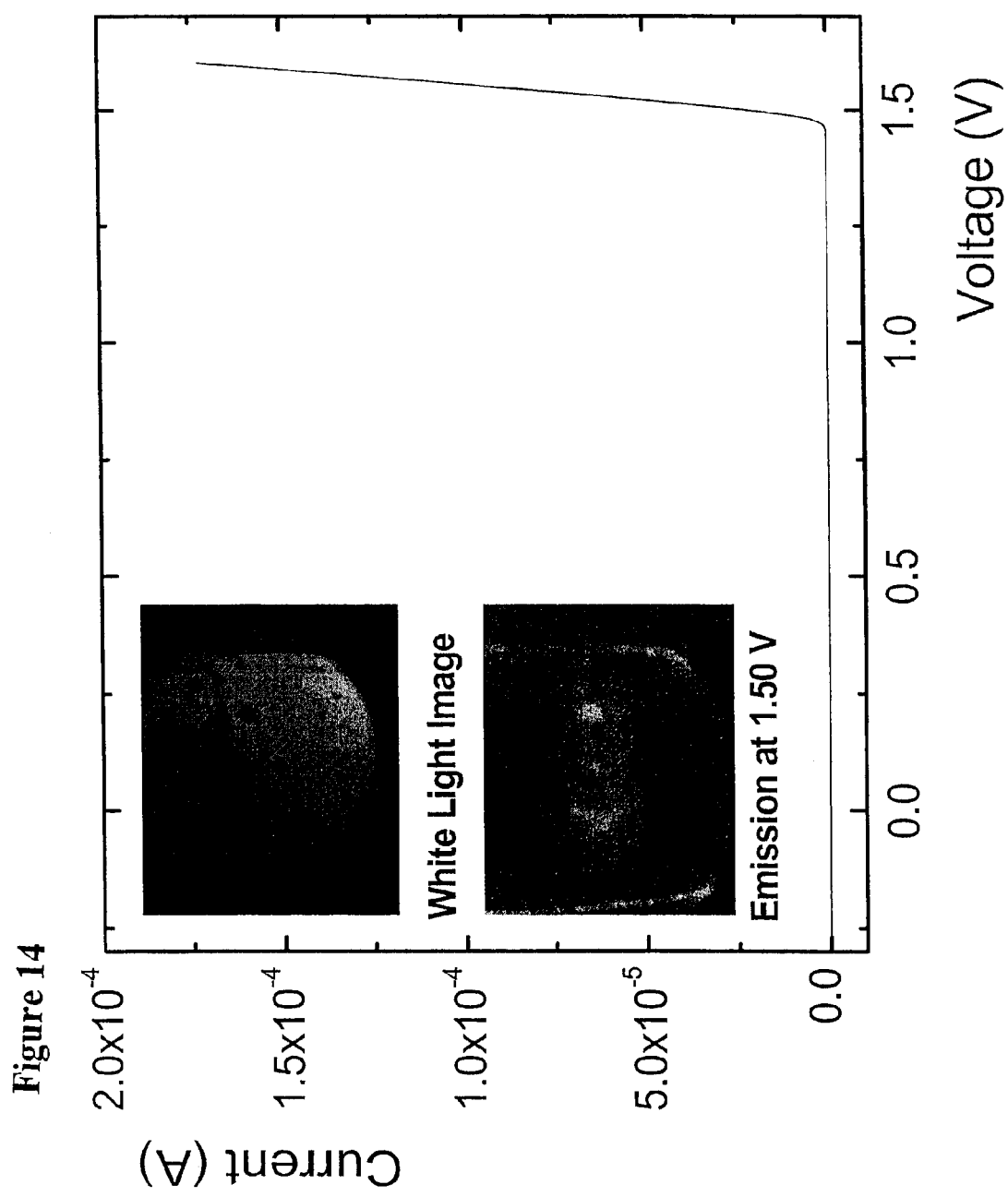
FIG. 14 shows an experimental current-voltage characteristic of the source of FIG. 13.

FIG. 14 shows the current-voltage characteristics measured on a device similar to that illustrated in FIG. 13. Current flow is measured between the n layer and the p layer. The bias represents the bias applied to the p-type layer with respect to the n-type layer. When the bias is approximately 1.45V a current flows through the device. In the inset is shown an image of the device under white light illumination at zero volts and an image of the device at 1.50V. The latter shows that emission is localised to the micron-sized areas defined by the apertures in the Aluminium p-contact layer on the surface of this device (although the emission picked up by the camera is predominantly 830 nm GaAs band-edge and 890 nm wetting layer emission this can be spectrally filtered out in experiments).

Figure 15:
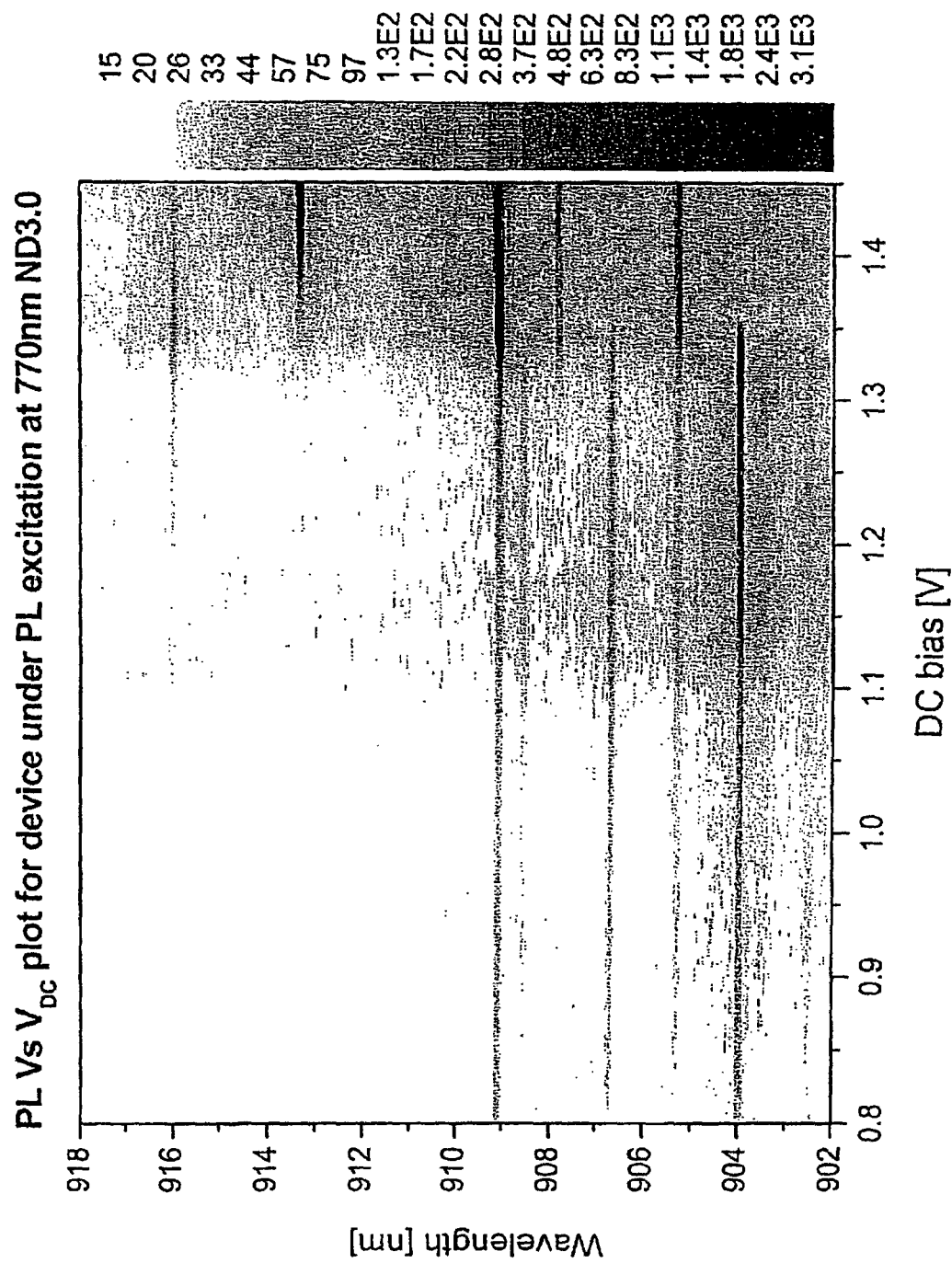
FIG. 15 shows experimental results from a source similar to that of FIG. 13 in which the state of the quantum dot is switched as a function of the applied bias. The data shown in FIG. 15 is illustrated as photoluminescence grey scale spectrum for the device when illuminated with radiation at 770 nm as the bias on the device is swept from 0.8V to 1.5V.

FIG. 15 shows a specific example of how the quantum dot state can be switched as a function of the applied voltage. The device discussed here is the same at that illustrated in FIG. 14. The figure shows the photoluminescence emission spectrum from a quantum dot excited with a laser as a function of the bias applied across the active region. In particular, FIG. 15 shows in grayscale the intensity of the emitted radiation against wavelength of the emitted radiation (y axis) against DC bias applied to device (x axis). The entire chart is in grayscale and there is a key to the grayscale shown at the right of the graph. Accordingly, the dark horizontal lines show strong emission from the device. Thus, at 1.42V the brightest lines are the charge neutral X and $X_2$ states (909.1 nm and 907.8 nm, respectively). Below 1.35V negative charges are swept from the quantum dot favouring an unbalance in the e−/h+ populations and resulting in intensity being transferred to the positively charged emission lines (904.0 and 906.8 nm).

Figure 16:
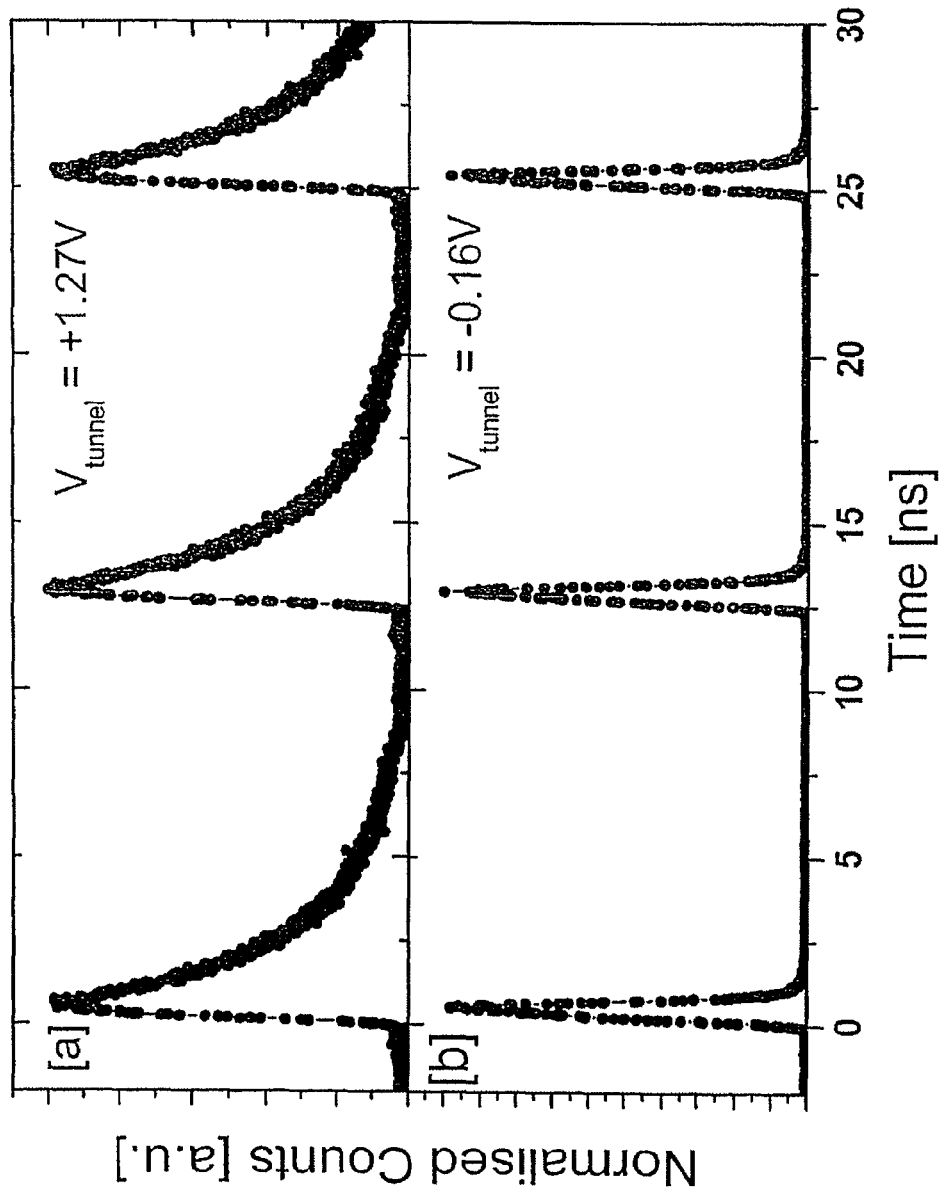
FIG. 16 shows time resolved data for the emission from the neutral exciton state of a quantum dot in the device of FIG. 13 under pulsed electrical excitation at a repetition frequency of 80 MHz.

FIG. 16 [a] shows time resolved data from the X state seen at 909.1 nm in FIG. 15 under pulsed electrical excitation with $V_{tunnel}$=+1.27V and with $V_{tunnel}$=−0.16V ([b]). In the former case the timescale over which the decay occurs is characterised by a time constant ~1.4 ns, in the latter case the decay time reduced by a factor of at least 5 to below the time resolution of our detection equipment. The clear reduction in the time window over which photons are emitted with the larger voltage pulses is in accordance with the present invention.

Figure 17:
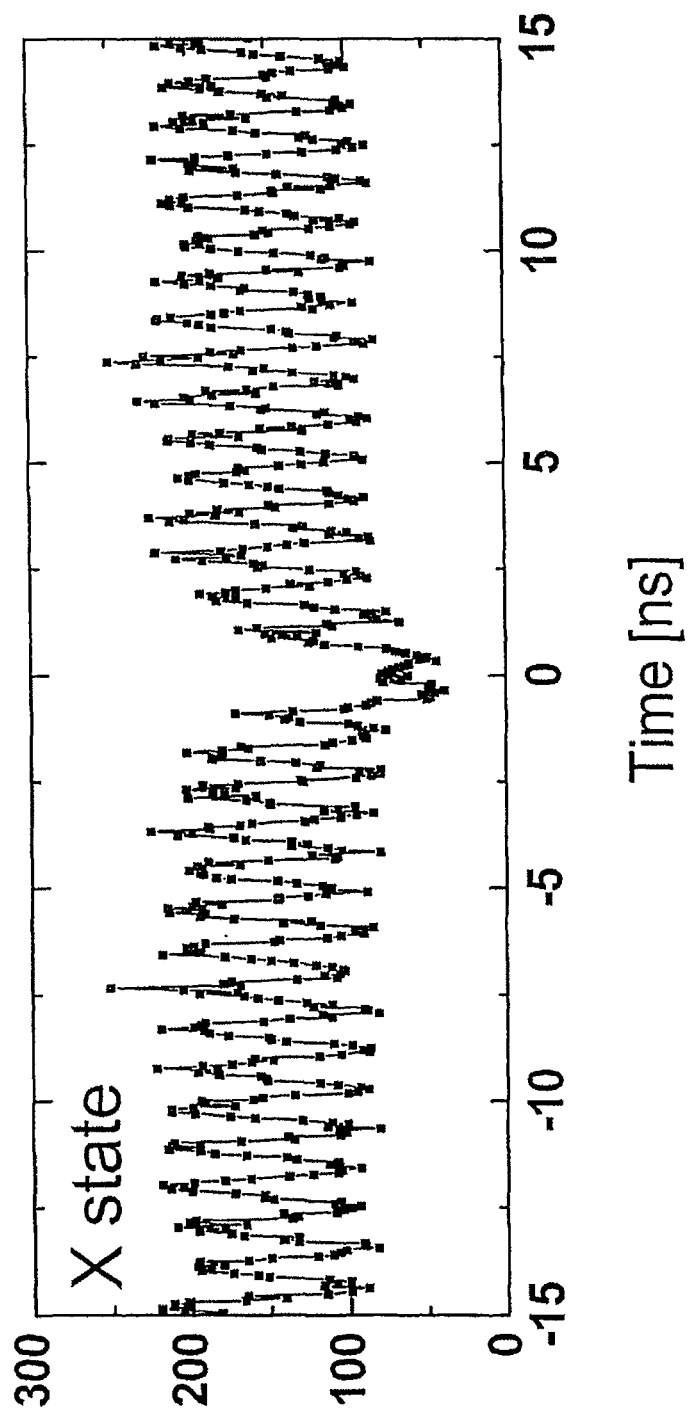
FIG. 17 shows auto-correlation data for the emission from the neutral exciton state of a quantum dot in the device of FIG. 13 under pulsed electrical excitation at a repetition frequency of 1.070 GHz.

FIG. 17 shows auto-correlation data recorded from the X state seen at 909.1 nm in FIG. 15 at 1.070 GHz repetition rate with a time average current of 4 μA. A reduction in the height of the central peak to below 50% of the height of the others proves that single photon emission is occurring.

Figure 18:
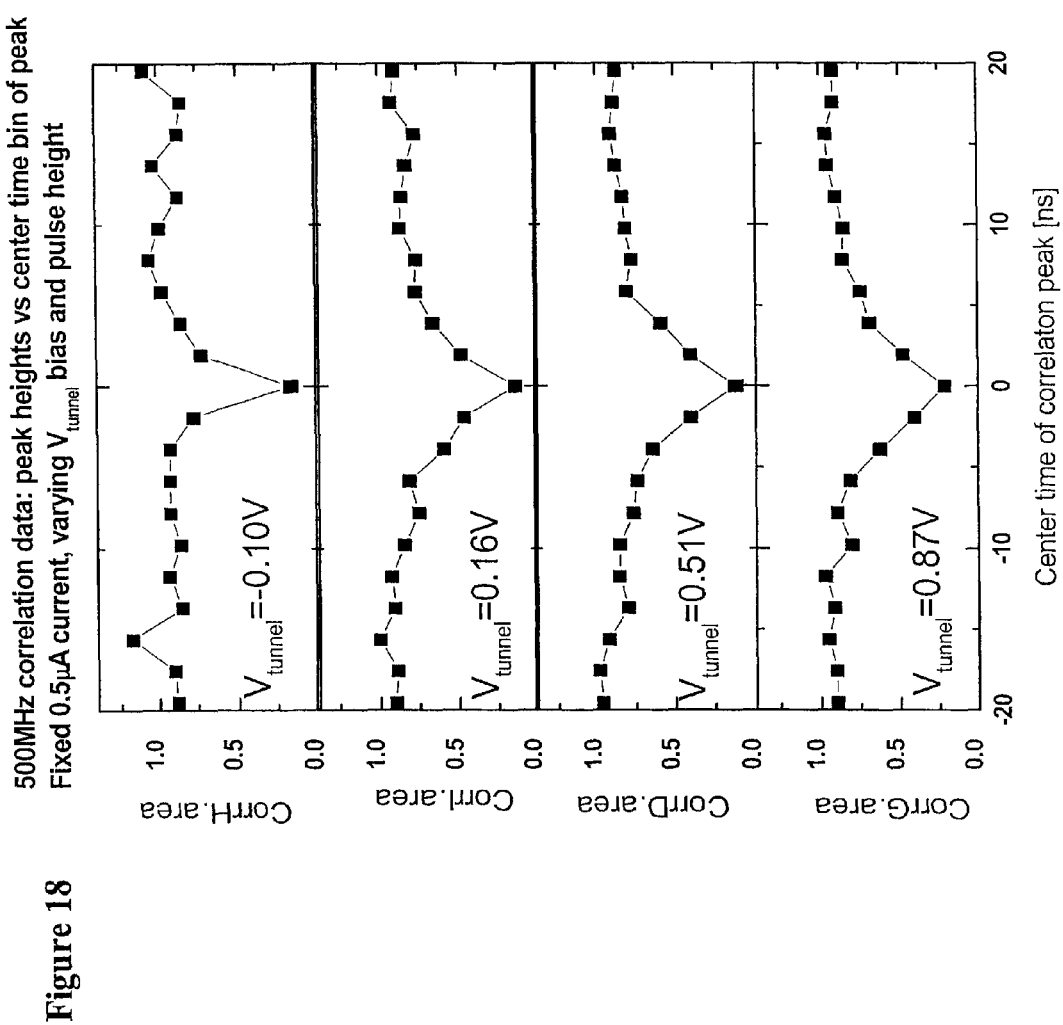
FIG. 18 shows auto-correlation data recorded under pulsed electrical excitation at a repetition frequency of 500 MHz for a variety of applied bias levels and fixed current.

FIG. 18 shows the area of the peaks in auto-correlation data (again, the X state seen at 909.1 nm in FIG. 15) recorded with 500 MHz repetition frequency, fixed current flow with a range of $V_{tunnel}$ levels. It is evident that the anti-bunching of photons around the central peak is reduced for the lower $V_{tunnel}$ levels.

It is clear that the "anti-bunching" of photons in adjacent pulses can be reduced by controlling the voltage that is applied between the "on" pulses (i.e. those that inject carriers). Possibilities for controlling the voltage include [1] reducing the $V_{tunnel}$ level between pulses; [2] using a large "negative" pulse (again, this could be short) to sweep carriers from the quantum dot or [3] switching the voltage to a point where carriers can tunnel out into a nearby quantum dot/quantum well bulk region. Band-structures that may facilitate these modes of operation were presented in FIGS. 5, 7 and 9.

Figure 19:
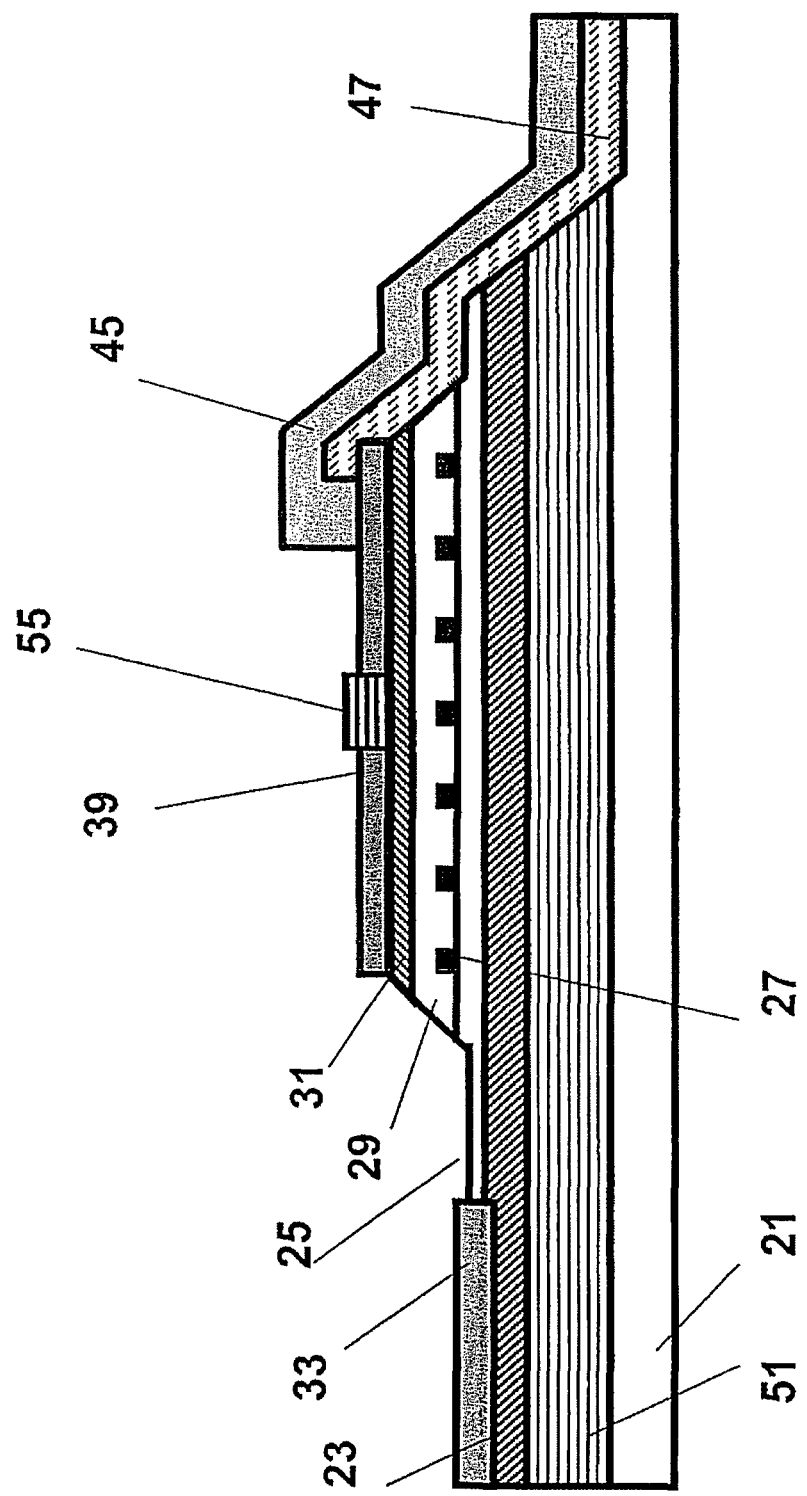
FIG. 19 illustrates a further source in accordance with the present invention
Figure 20:
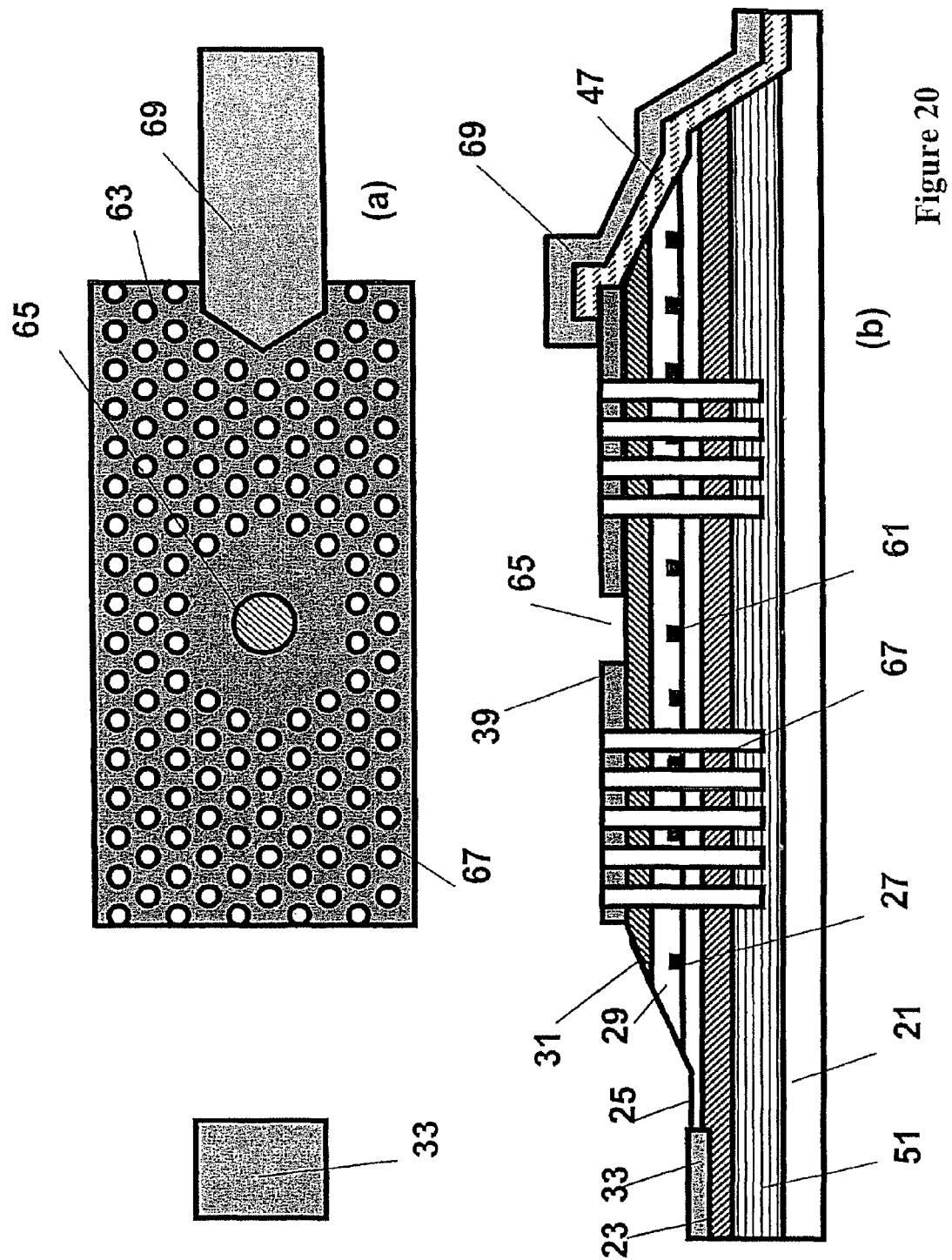
FIG. 20 illustrates a source in accordance with a third embodiment of the present invention
Figure 21:
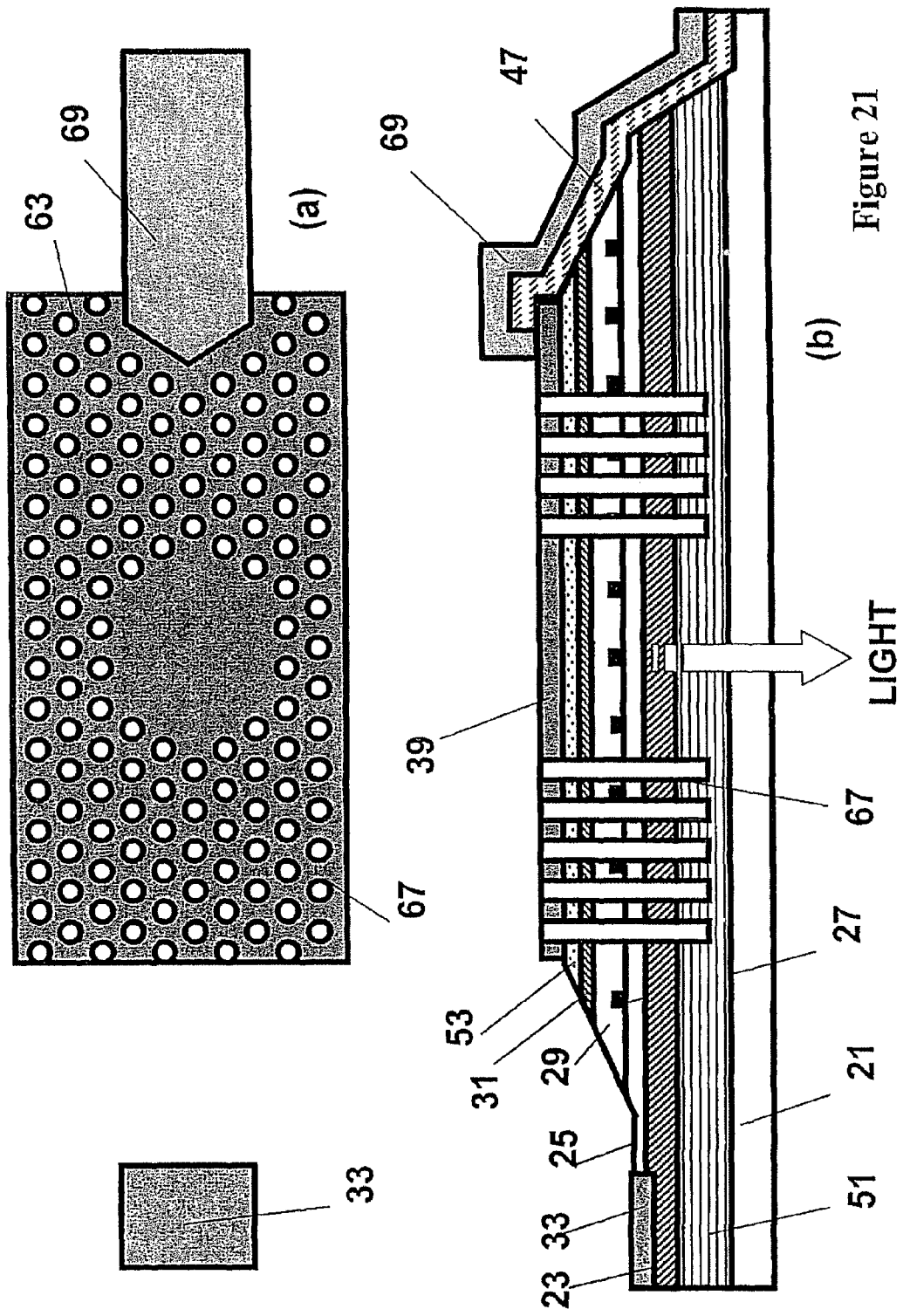
FIG. 21 illustrates a source in accordance with a fourth embodiment of the present invention.

Variations on the device shown in FIG. 13 which offer alternative methods in which the collection efficiency for emitted photons can be improved are discussed in relation to FIG. 19-21.

FIG. 19 illustrates a further variation on the device of FIG. 13. To avoid unnecessary repetition, like reference numerals are used to denote like features. In the device of FIG. 19, an upper Bragg mirror 55 is provided. It may be provided in the aperture 41 formed in mask layer 39 or across a larger section of the surface.

There are two preferred methods of fabricating this structure. In the first method, the upper Bragg mirror is grown as part of the first growth directly on top of p-type layer 31.

P-type contacts and n-type contacts are formed in the same manner as described with reference to FIG. 13. Before forming the n-type contacts, the upper Bragg mirror is removed from the contact region such that the contacts can be placed on n-type layer 23.

The Bragg mirror 55 is then etched down to the p-type layer 31. The Al mask layer 39 is then formed. First, the layer is patterned using a photoresist and photoresist pattern such that after development, the whole device is covered with photoresist except for the area where the Al mask is to be formed. The central area of the mask with the aperture to be formed is also covered with photoresist to protect the Bragg mirror below.

The Al mask is then deposited on the p-type layer 31 and a lift-off process if then conducted to remove aluminium which overlies photoresist.

As an alternative fabrication method, the growth of the device can be stopped at the top of the growth of p-type layer 31 and the upper Bragg mirror can be added as a separate evaporation of suitable dielectric layers.

The Bragg mirror may also be formed of alternate layers of $SiO_2$ and $TiO_2$. These dielectric layers have low absorption at the operational wavelength. For an operational wavelength of $\lambda=1.3$ μm, the thickness of the $SiO_2$ and $TiO_2$ layers are approximately 221 nm and 138 nm respectively. For $\lambda=1.5$ μm, the layers are 264 nm and 164 nm respectively.

This type of structure also has further advantages since only photons emitted from quantum dots in the active region are subjected to strong optical confinement. The dots emit into the optical mode of the cavity which enhances the radiative recombination rate of the dots in the cavity relative to the dots outside the cavity. The faster radiative recombination rate of the dots in the active region also helps to define the active region.

Variations on this device (and that in FIG. 13) can be envisaged in which the contacts are reversed such that the region below the QD layer 27 is p-doped and that above is n-doped.

FIG. 20 illustrates a further variation on the device of FIG. 13. [a] illustrates a plan view of the device and [b] is a cross-sectional view. To avoid unnecessary repetition, like reference numerals are used to denote like features.

The active area 61 is provided within a three dimensional optical cavity. Optical confinement in the third dimension i.e. in the dimension within the plane of the layers is achieved using a photonic band gap structure (PBG).

After the structure has been fabricated, a pattern of holes is etched through the layer structure. This pattern is clearly shown in the plan view of the structure. In this plan view, 63 represents the upper surface of mask 39, the emission aperture 65 is located in the centre of this mask and holes 67 form the photonic structure. The mask 63 is contacted by contact pad 69. P-type ohmic contact 33 is provided on the opposing side of the mask to contact pad 69.

In the plan view of FIG. 20, the holes 67 extend into lower Bragg mirror 51. The holes 67 create a periodic variation in the refractive index which acts like a Bragg mirror in the plane of the layers.

The holes may extend into part of the lower Bragg mirror or they may extend through the entire Bragg mirror.

The holes are etched using reactive ion beam etching (RIE). Missing holes in the centre of the pattern define the cavity in the second and third dimensions. In this particular example, about one to seven missing holes are used. In this structure, the hole spacing will be from 300 to 700 nm with the hole diameter from 100 to 500 nm.

Although the patterns illustrated in FIGS. 20 and 21 are hexagonal arrays of holes with a central "defect" of missing holes many other variations are possible, including square arrays and irregular arrays. Also, "modified" regular arrays (where the first period of holes around the aperture 65 is changed in size and/or position to increase the level of optical confinement and/or quality factor of the cavity) may offer advantages.

FIG. 21 illustrates a variation on the device of FIG. 20. [a] illustrates a plan view of the device and [b] is a cross-sectional view. To avoid unnecessary repetition, like reference numerals are used to denote like features. The device is similar to that of FIG. 20, except that there is no emission aperture 65 provided in mask 39.

Since the metal mask 39 is continuous in the cavity region, its reflectivity is maximised, in turn increasing the optical confinement. Emission from the dots in the cavity is isolated due to their coupling with the strong optical fields in the cavity. Thus, the cavity provides a spectral filter as photons emitted by dots whose energy is substantially equal to that of the cavity mode will be predominantly emitted.

In contrast to the other described devices, light is extracted from the bottom face of the device, since Bragg mirror 51 has lower reflectivity than the metal reflector 39. Also, an additional undoped "phase matching" layer 53 must be inserted into the cavity to ensure that light reflected by the metallic layer 39 is reflected with the correct phase such that an antinode in the optical electric field exists near the QD layer 27.

The operation of the devices of FIGS. 19-21 will be as described in any of FIGS. 3-5 or 11-12.

The invention claimed is:

1. A photon source comprising a photon source body comprising at least one quantum dot;
    electrical contacts positioned to allow an electric field to be applied across said at least one quantum dot;
    an optical source for optically exciting the source body; and
    a bias source configured to generate a bias sequence having at least first and second bias levels, said bias source connected to said contacts and applying said bias sequence across said electrical contacts, said bias sequence generating said first bias level sufficient to allow population of the quantum dot by at least one electron and hole due to optical excitation by said optical source to form a first excitonic complex in said quantum dot and a second bias level, different to the first bias level, wherein a photon being emitted due to decay of an excitonic complex at the second bias level will have a different energy to a photon emitted due to decay of the excitonic complex at the first bias level.

2. A photon source as claimed in claim 1, wherein the source is configured such that changing the bias between the two bias levels changes the number of carriers in the quantum dot.

3. A photon source as claimed in claim 1, wherein the source is configured such that changing the bias between the two bias levels changes the exciton energy of the excitonic complex.

4. A photon source as claimed in claim 1, wherein the source is configured such that changing the bias between the two bias levels empties all carriers from the quantum dot.

5. A photon source as claimed in claim 1, wherein the source is configured such that changing the bias between the two bias levels separates carriers of different types such that their wave-forms substantially do not overlap.

6. A photon source as claimed in claim 1, wherein the source is configured such that changing the bias between the two bias levels moves the carriers into an optically "dark" state.

7. A photon source as claimed in claim 1, wherein the optical source is pulsed.

8. A photon source as claimed in claim 1, wherein the optical source is continuous.

9. A photon source as claimed in claim 1, wherein the source body comprises a p-i-n structure and wherein the at least one quantum dot is located in the intrinsic region of said p-i-n structure.

10. A photon source as claimed in claim 1, wherein the source body comprises a p-i-n structure and wherein the electron energy levels of the quantum dot can be changed relative to the Fermi energy.

11. A photon source as claimed in claim 1, wherein the source body comprises a p-i-n structure and wherein the hole energy levels of the quantum dot can be changed relative to the Fermi energy.

12. A photon source as claimed in claim 1, wherein the source body comprises at least two quantum dots, the dots being configured such that at a first bias level carriers are injected into a first quantum dot and at a second bias level carriers of different polarities are separated into two quantum dots.

13. A photon source as claimed in claim 1, wherein the source body comprises a schottky-i-n structure and the at least one quantum dot is located in the intrinsic region of the structure.

14. A photon source as claimed in claim 1, wherein the source body comprises a plurality of quantum dots and the photon source further comprises an active region within said source body such that emission is only collected from a dot or a limited number of dots within said active region.

* * * * *